US011211127B1

(12) United States Patent
Lien et al.

(10) Patent No.: US 11,211,127 B1
(45) Date of Patent: Dec. 28, 2021

(54) LOOP DEPENDENT PLANE SKEW METHODOLOGY FOR PROGRAM OPERATION

(71) Applicant: SanDisk Technologies LLC, Addison, TX (US)

(72) Inventors: Yu-Chung Lien, San Jose, CA (US); Hua-Ling Hsu, Fremont, CA (US); Huai-Yuan Tseng, San Ramon, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/912,917

(22) Filed: Jun. 26, 2020

(51) Int. Cl.
| G11C 11/56 | (2006.01) |
| G11C 16/04 | (2006.01) |
| G11C 16/10 | (2006.01) |
| G11C 16/24 | (2006.01) |
| G11C 16/32 | (2006.01) |
| H01L 27/11582 | (2017.01) |
| H01L 27/11519 | (2017.01) |
| H01L 27/11565 | (2017.01) |
| H01L 27/11556 | (2017.01) |

(52) U.S. Cl.
CPC .......... *G11C 16/10* (2013.01); *G11C 16/0483* (2013.01); *G11C 16/24* (2013.01); *G11C 16/32* (2013.01); *G11C 11/5621* (2013.01); *G11C 11/5671* (2013.01); *H01L 27/11519* (2013.01); *H01L 27/11556* (2013.01); *H01L 27/11565* (2013.01); *H01L 27/11582* (2013.01)

(58) Field of Classification Search
CPC ..... G11C 16/0483; G11C 16/10; G11C 16/26; G11C 11/5628; G11C 16/08; G11C 11/5642; G11C 16/3459; G11C 16/24; G11C 16/3418; G11C 11/4085; G11C 11/409
See application file for complete search history.

(56) References Cited

U.S. PATENT DOCUMENTS

| 9,595,343 B1* | 3/2017 | Srinivasan | ......... G11C 16/3459 |
| 11,037,635 B1* | 6/2021 | Lien | .................. G11C 16/0483 |
| 2019/0348129 A1* | 11/2019 | Chin | .................. G11C 11/5628 |
| 2019/0392893 A1* | 12/2019 | Yang | ...................... G11C 16/28 |
| 2020/0152282 A1* | 5/2020 | Yang | ...................... G11C 16/26 |

* cited by examiner

*Primary Examiner* — Hien N Nguyen
(74) *Attorney, Agent, or Firm* — Dickinson Wright PLLC; Steven Hurles

(57) ABSTRACT

An apparatus, disclosed herein, comprises a plurality of planes, each plane of the plurality of planes including a plurality of memory cells and a control circuit coupled to the plurality of memory cells. The control circuit is configured to: determine a position of a program loop in a sequence of program loops performed to complete a programming operation; initiate an inhibit bit line ramping event for the first plane including ramping of a set of bit lines of a first plane up to an inhibit voltage and based on the position of the program loop, initiate an inhibit bit line ramping event with a ramping start time delay for a second plane, where the inhibit bit line ramping event for the second plane includes initiating ramping of a set of bit lines of the second plane up to the inhibit voltage after the ramping start time delay.

20 Claims, 24 Drawing Sheets

FIG. 7B

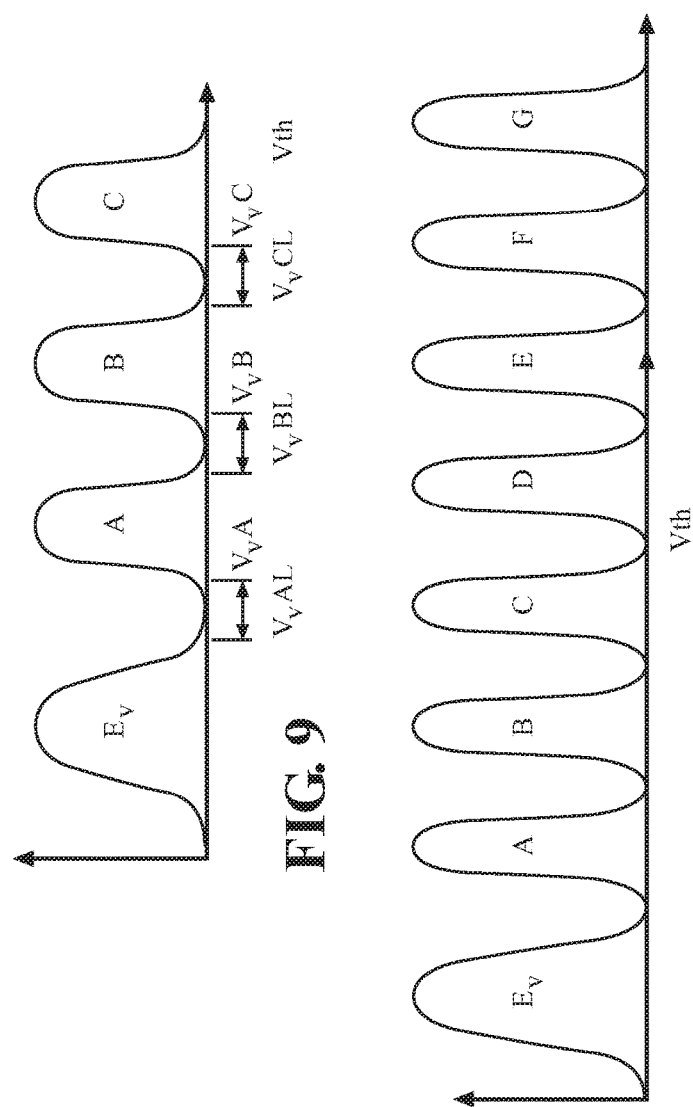
FIG. 9
FIG. 10
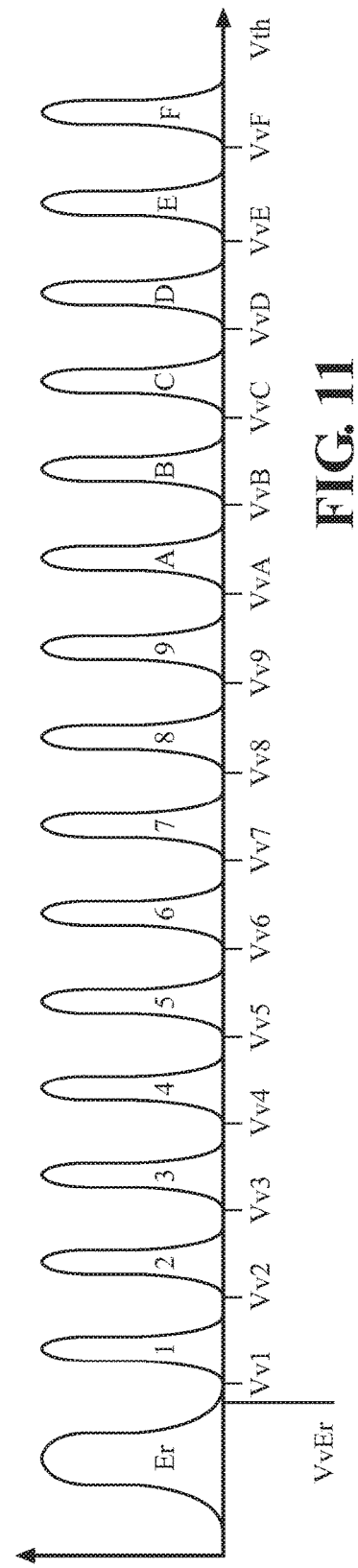
FIG. 11

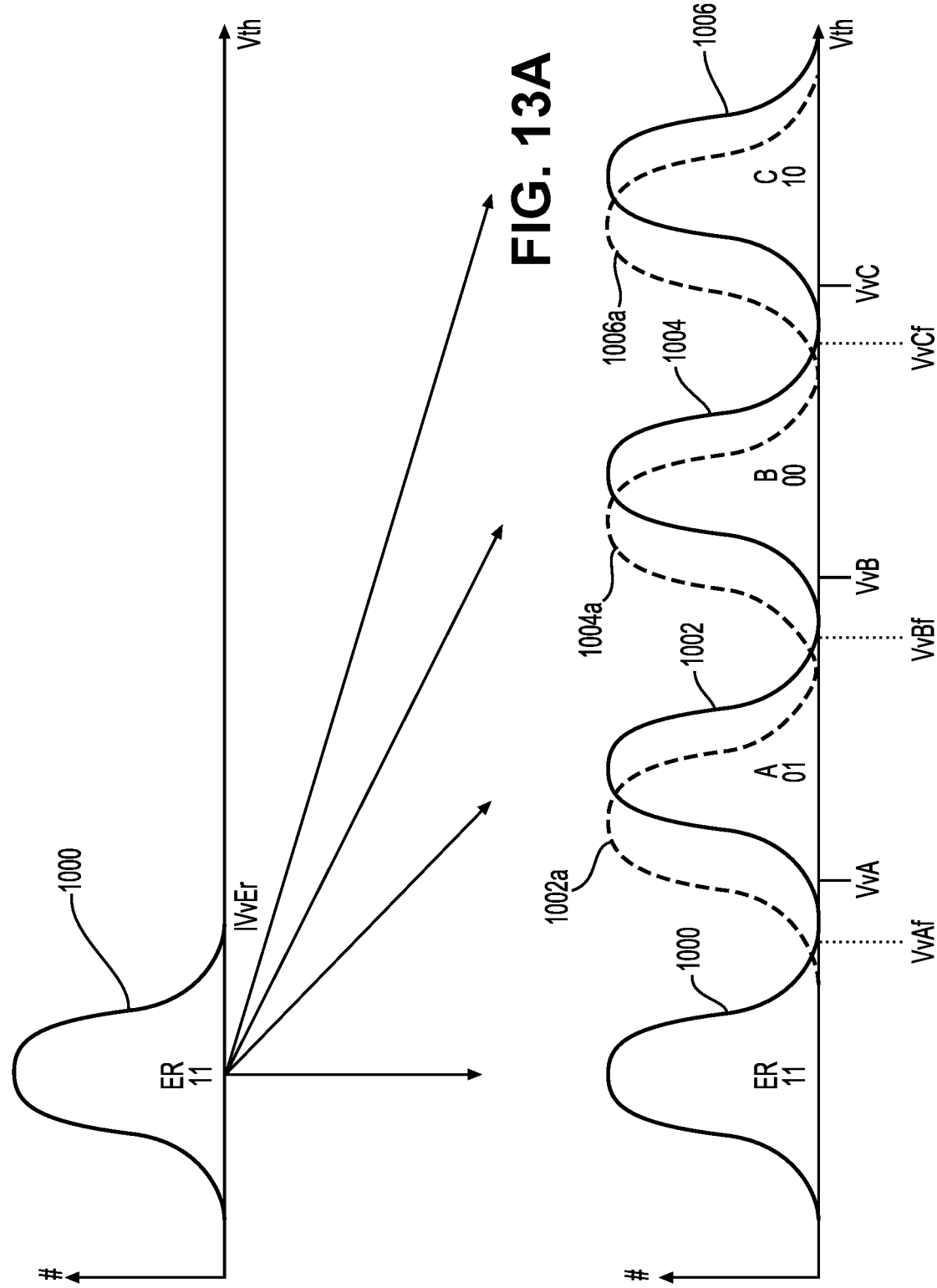

LOOP DEPENDENT PLANE SKEW METHODOLOGY FOR PROGRAM OPERATION

FIELD

This application relates to non-volatile memory apparatuses and the operation of non-volatile memory apparatuses.

BACKGROUND

This section provides background information related to the technology associated with the present disclosure and, as such, is not necessarily prior art.

Semiconductor memory apparatuses have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory apparatuses to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

SUMMARY

This section provides a general summary of the present disclosure and is not a comprehensive disclosure of its full scope or all of its features and advantages.

An object of the present disclosure is to provide a memory apparatus and a method of operation of the memory apparatus that address and overcome shortcomings described herein.

Accordingly, it is an aspect of the present disclosure to provide an apparatus, comprising: a plurality of planes, each plane of the plurality of planes including a plurality of memory cells; and a control circuit coupled to the plurality of memory cells. The control circuit configured to: determine a position of a program loop in a sequence of program loops performed to complete a programming operation on a set of memory cells, where the set of memory cells include memory cells of a first plane of the plurality of planes and memory cells of a second plane of the plurality of planes. The control circuit further configured to initiate an inhibit bit line ramping event for the first plane including ramping of a set of bit lines of the first plane up to an inhibit voltage and based on the position of the program loop in the sequence of program loops, initiate an inhibit bit line ramping event with a ramping start time delay for the second plane, where the inhibit bit line ramping event for the second plane includes initiating ramping of a set of bit lines of the second plane up to the inhibit voltage after the ramping start time delay and ramping of the set of bit lines of the second plane starts at a time after ramping of the set bit lines of the first plane has started. The control circuit further configured to perform the program loop on the set of memory cells.

Additionally, it is an aspect of the present disclosure to provide a method of operating a memory apparatus including a plurality of planes, each plane of the plurality of planes including a plurality of memory cells. The method comprises the steps of: determining a position of a program loop in a sequence of program loops performed to complete a programming operation on a set of memory cells, the set of memory cells including memory cells of a first plane of the plurality of planes and memory cells of a second plane of the plurality of planes; initiating an inhibit bit line ramping event for the first plane including ramping of a set of bit lines of the first plane up to an inhibit voltage; and based on the position of the program loop in the sequence of program loops, initiating an inhibit bit line ramping event with a ramping start time delay for the second plane, the inhibit bit line ramping event for the second plane including initiating ramping of a set of bit lines of the second plane up to the inhibit voltage after the ramping start time delay, wherein ramping of the set of bit lines of the second plane starts at a time after ramping of the set bit lines of the first plane has started; and performing the program loop on the set of memory cells.

Additionally, it is an aspect of the present disclosure to provide a memory die of a memory device, the memory die comprising: a plurality of planes, each plane of the plurality of planes including a plurality of memory cells; and control circuitry coupled to the plurality of memory cells. The control circuitry configured to: determine a position of a program loop in a sequence of program loops performed to complete a programming operation on a set of memory cells, where the set of memory cells include memory cells of a first plane of the plurality of planes and memory cells of a second plane of the plurality of planes. The control circuitry further configured to initiate an inhibit bit line ramping event for the first plane including ramping of a set of bit lines of the first plane up to an inhibit voltage; and based on the position of the program loop in the sequence of program loops, initiate an inhibit bit line ramping event with a ramping start time delay for the second plane, where the inhibit bit line ramping event for the second plane including initiating ramping of a set of bit lines of the second plane up to the inhibit voltage after the ramping start time delay and ramping of the set of bit lines of the second plane starts at a time after ramping of the set bit lines of the first plane has started. The control circuitry further configured to perform the program loop on the set of memory cells.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

For a detailed description of example embodiments, reference will now be made to the accompanying drawings in which:

FIG. 7B depicts a top view of an example top dielectric layer DL19 of the stack of FIG. 6B;

FIG. 9 depicts the Vth distributions of memory cells in an example one-pass programming operation with four data states;

FIG. 10 depicts the Vth distributions of memory cells in an example one-pass programming operation with eight data states;

FIG. 11 depicts the Vth distributions of memory cells in an example one-pass programming operation with sixteen data states;

FIGS. 13A and 13B depict the Vth distributions of memory cells;

DETAILED DESCRIPTION

Figure 1B:
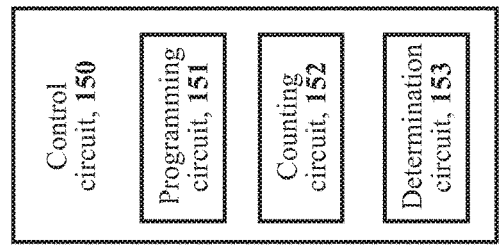
FIG. 1B is a block diagram of an example control circuit which comprises a programming circuit, a counting circuit, and a determination circuit.

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of forming of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections.

Additionally, when a layer or element is referred to as being "on" another layer or substrate, in can be directly on the other layer of substrate, or intervening layers may also be present. Further, it will be understood that when a layer is referred to as being "under" another layer, it can be directly under, and one or more intervening layers may also be present. Furthermore, when a layer is referred to as "between" two layers, it can be the only layer between the two layers, or one or more intervening layers may also be present.

As described, non-volatile memory systems are a type of memory that retains stored information without requiring an external power source. Non-volatile memory is widely used in various electronic devices and in stand-alone memory devices. For example, non-volatile memory can be found in laptops, digital audio player, digital cameras, smart phones, video games, scientific instruments, industrial robots, medical electronics, solid-state drives, USB drives, memory cards, and the like. Non-volatile memory can be electronically programmed/reprogrammed and erased.

Examples of non-volatile memory systems include flash memory, such as NAND flash or NOR flash. NAND flash memory structures typically arrange multiple memory cell transistors (e.g., floating-gate transistors or charge trap transistors) in series with and between two select gates (e.g., a drain-side select gate and a source-side select gate). The memory cell transistors in series and the select gates may be referred to as a NAND string. NAND flash memory may be scaled in order to reduce cost per bit.

In current flash memory design, one of the most challenging issues is reducing peak current consumption (peak ICC), which can lead to peak power drop causing malfunctions in flash memory. More specifically, in the case of multiple concurrently operated flash memories of a memory device, peak ICC is multiplied by the number of flash memories that are operated concurrently. Thus, reduction of peak ICC per flash memory can help a memory device work within a peak current limitation of a host.

Embodiments described herein provide an approach for reducing peak ICC in flash memory. In particular, embodiments described herein are directed to implementation of a plane skew methodology in a die of a memory device. For example, the plane skew methodology comprises determining a position of a program loop in a sequence of program loops of a program operation and based on the position of the program loop in the sequence of program loops, initiating an inhibit bit line ramping event for a first plane and initiating an inhibit bit line ramping event with a ramping start time delay for a second plane, where ramping of a set of bit lines of the second plane starts at a time, indicated by the ramping start time delay, after ramping of a set bit lines of the first plane has started.

A programming operation for a set of memory cells of a memory device typically involves applying a series of program voltages to the memory cells after the memory cells are provided in an erased state. Each program voltage is provided in a program loop, also referred to as a program-verify iteration. For example, the program voltage may be applied to a word line which is connected to control gates of the memory cells. In one approach, incremental step pulse programming is performed, where the program voltage is increased by a step size in each program loop. Verify operations may be performed after each program voltage to determine whether the memory cells have completed programming. When programming is completed for a memory cell, it can be locked out from further programming while programming continues for other memory cells in subsequent program loops.

Each memory cell may be associated with a data state according to write data in a program command. Based on its data state, a memory cell will either remain in the erased state or be programmed to a data state (a programmed data state) different from the erased state. For example, in a one-bit per cell memory device (single-level cell (SLC)), there are two data states including the erased state and one higher data state. In a two-bit per cell memory device (multi-level cell (MLC)), there are four data states including the erased state and three higher data states referred to as the A, B and C data states (see FIG. 9). In a three-bit per cell memory device (triple-level cell (TLC)), there are eight data states including the erased state and seven higher data states referred to as the A, B, C, D, E, F and G data states (see FIG. 10). In a four-bit per cell memory device (quad-level cell (QLC)), there are sixteen data states including the erased state and fifteen higher data states referred to as the Er, 1, 2, 3, 4, 5, 6, 7, 8, 9, A, B, C, D, E and F data states (see FIG. 11). Each memory cell may store a data state (e.g., a binary value) and is programmed to a threshold voltage state corresponding to the data state. Each state represents a different value and is assigned a voltage window including a range of possible threshold voltages.

When a program command is issued, the write data is stored in latches associated with the memory cells. During programming, the latches of a memory cell can be read to determine the data state to which the cell is to be programmed. Each programmed data state is associated with a verify voltage such that a memory cell with a given data state is considered to have completed programming when a sensing operation determines its threshold voltage (Vth) is above the associated verify voltage. A sensing operation can determine whether a memory cell has a Vth above the associated verify voltage by applying the associated verify voltage to the control gate and sensing a current through the memory cell. If the current is relatively high, this indicates the memory cell is in a conductive state, such that the Vth is less than the control gate voltage. If the current is relatively low, this indicates the memory cell is in a non-conductive state, such that the Vth is above the control gate voltage.

The verify voltage which is used to determine that a memory cell has completed programming may be referred to as a final or lockout verify voltage. In some cases, an additional verify voltage may be used to determine that a memory cell is close to completion of the programming. This additional verify voltage may be referred to as an offset verify voltage, and may be lower than the final verify voltage. When a memory cell is close to completion of programming, the programming speed of the memory cell may be reduced such as by elevating a voltage of a respective bit line during one or more subsequent program voltages. For example, in FIG. 9, a memory cell which is to be programmed to the A data state may be subject to verify tests at VvAL, an offset verify voltage of the A data state, and VvA, a final verify voltage of the A data state.

To help further illustrate the foregoing, FIG. 1A will now be described. FIG. 1A is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided, e.g., for verify parameters as described herein.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to program memory cells of a word line of a block and verify the set of the memory cells. The control circuits can also include a counting circuit configured to determine a number of memory cells that are verified to be in a data state. The control circuits can also include a determination circuit configured to determine, based on the number, whether the block is faulty.

Figure 1A:
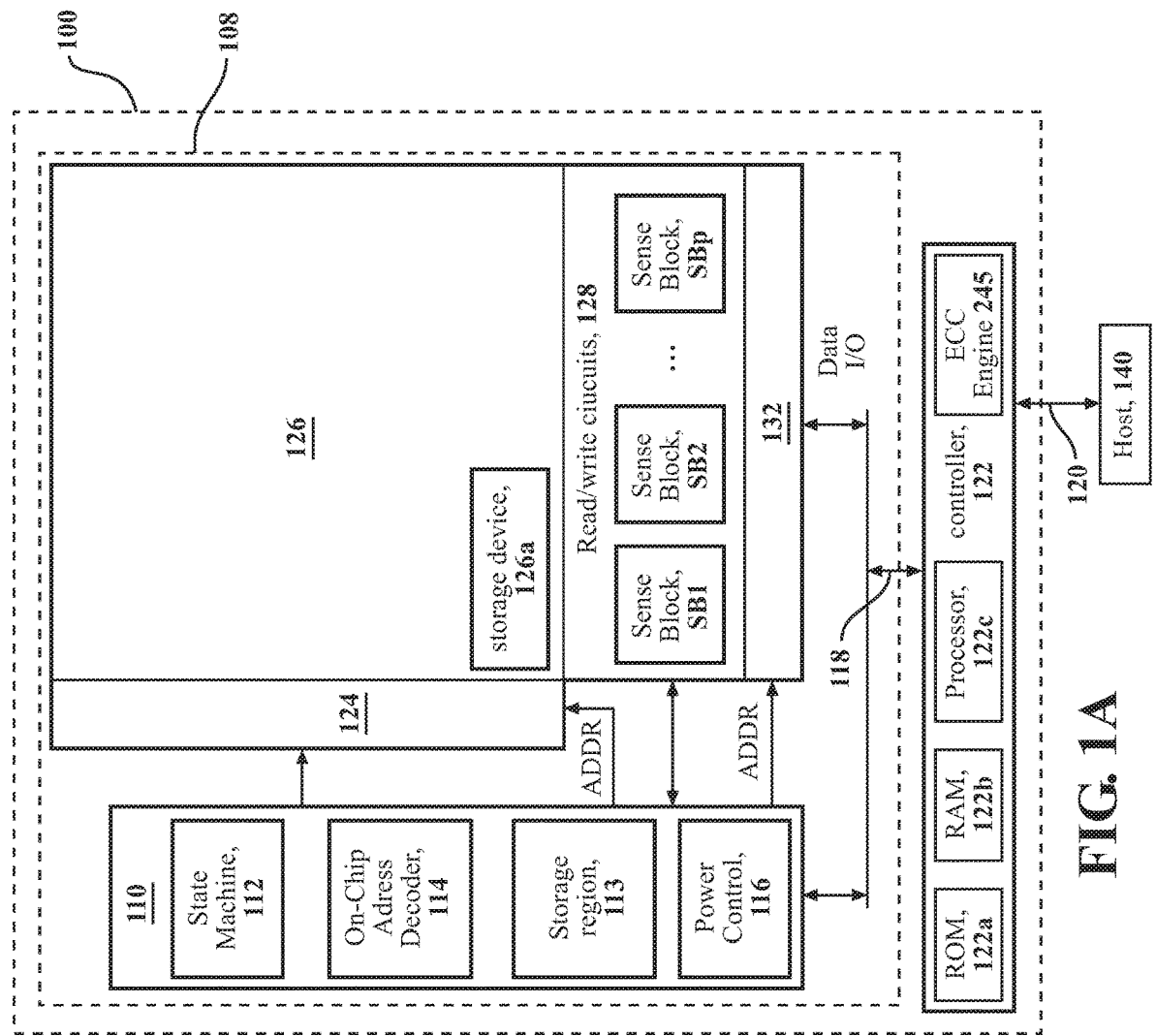
FIG. 1A is a block diagram of an example memory device.

For example, FIG. 1B is a block diagram of an example control circuit 150 which comprises a programming circuit 151, a counting circuit 152 and a determination circuit 153. The programming circuit may include software, firmware and/or hardware which implements, e.g., steps 1202 and 1204 of FIG. 12. The counting circuit may include software, firmware and/or hardware which implements, e.g., step 1206 of FIG. 12. The determination circuit may include software, firmware and/or hardware which implements, e.g., step 1208 of FIG. 12.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. However, uncorrectable errors may exist in some cases. The techniques provided herein reduce the likelihood of uncorrectable errors.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller 122 to access the memory structure such as for programming, read and erase operations. The code can include boot code and control code (e.g., set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

Figure 2:
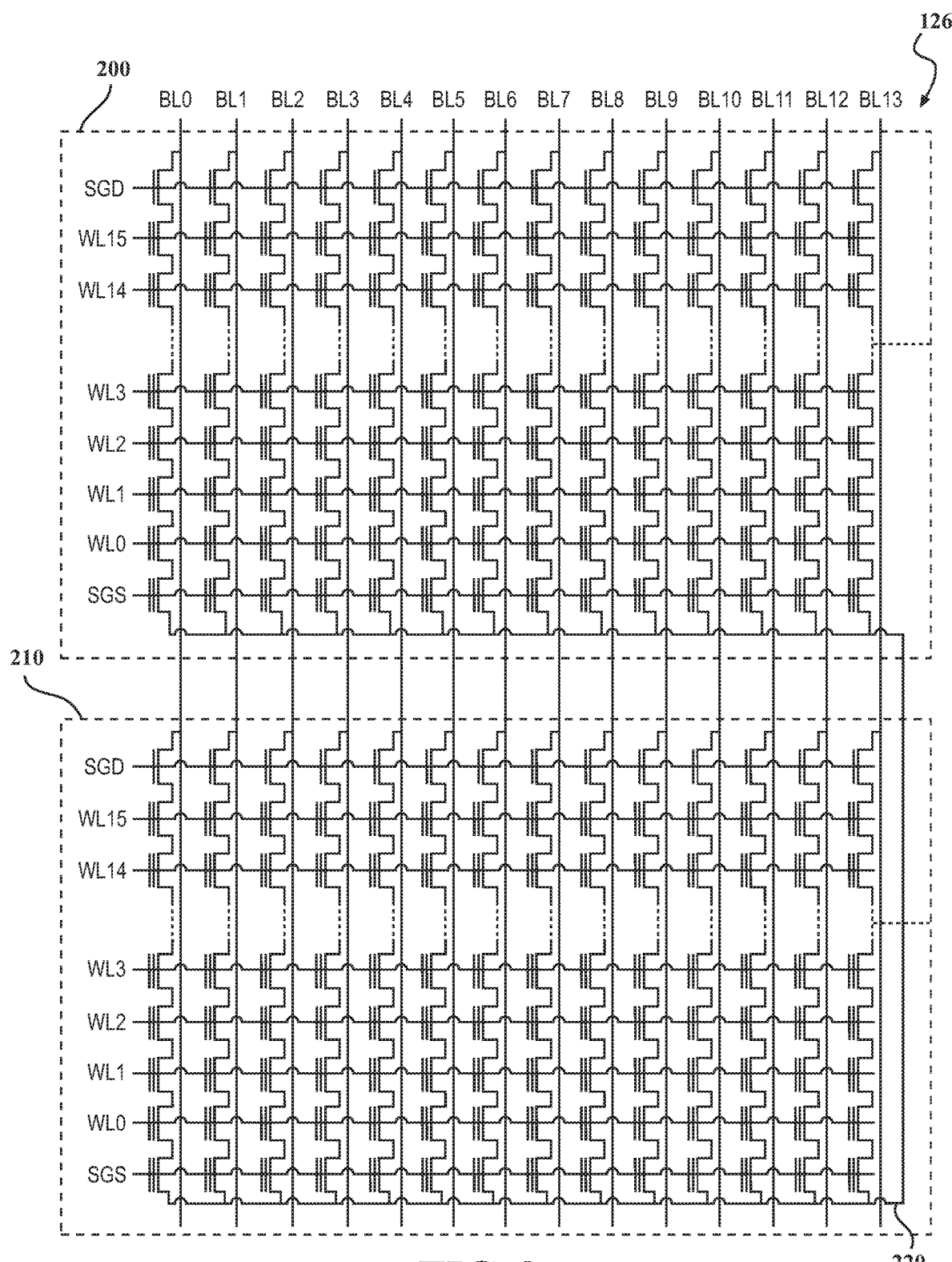
FIG. 2 depicts blocks of memory cells in an example two-dimensional configuration of the memory array of FIG. 1.

FIG. 2 depicts blocks of memory cells in an example two-dimensional configuration of the memory array 126 of FIG. 1. The memory array can include many blocks. Each example block 200, 210 includes a number of NAND strings and respective bit lines, e.g., BL0, BL1, . . . which are shared among the blocks. Each NAND string is connected at one end to a drain select gate (SGD), and the control gates of the drain select gates are connected via a common SGD line. The NAND strings are connected at their other end to a source select gate which, in turn, is connected to a common source line 220. Sixteen word lines, for example, WL0-WL15, extend between the source select gates and the drain select gates. In some cases, dummy word lines, which contain no user data, can also be used in the memory array adjacent to the select gate transistors. Such dummy word lines can shield the edge data word line from certain edge effects.

One type of non-volatile memory which may be provided in the memory array is a floating gate memory. See FIGS. 3A and 3B. Other types of non-volatile memory can also be used. For example, a charge-trapping memory cell uses a non-conductive dielectric material in place of a conductive floating gate to store charge in a non-volatile manner. See FIGS. 4A and 4B. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 3A:
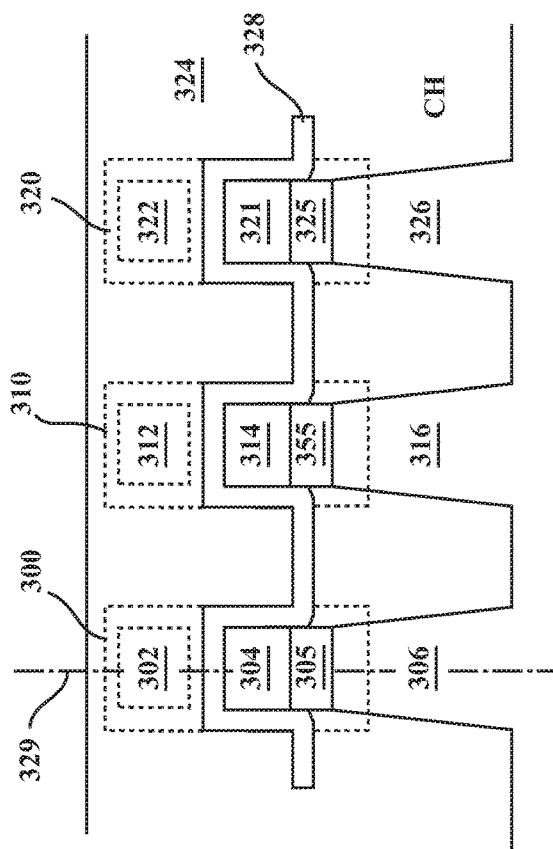
FIG. 3A depicts a cross-sectional view of example floating gate memory cells in NAND strings.

FIG. 3A depicts a cross-sectional view of example floating gate memory cells in NAND strings. A bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell is in a different respective NAND string. An inter-poly dielectric (IPD) layer 328 is also depicted. The control gates are portions of the word line. A cross-sectional view along line 329 is provided in FIG. 3B.

Figure 4A:
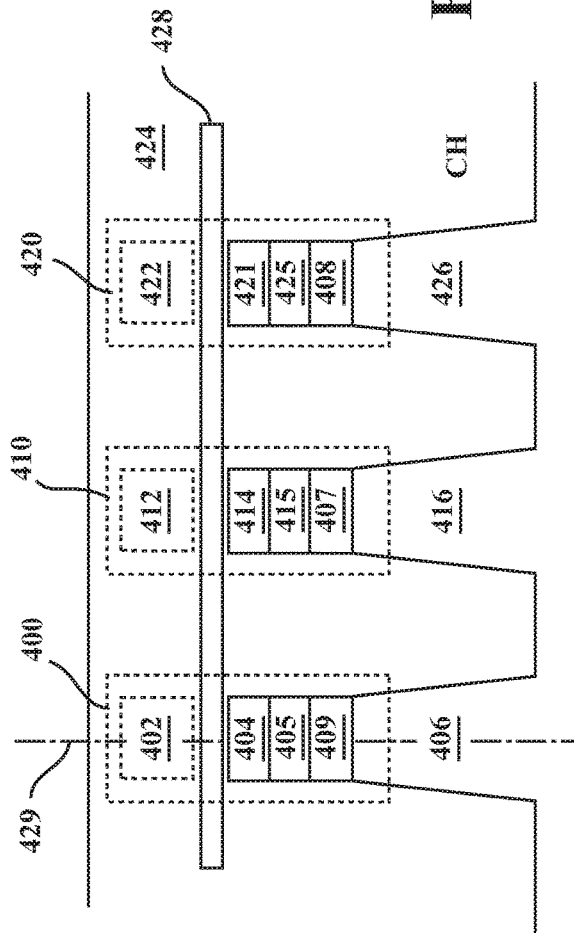
FIG. 4A depicts a cross-sectional view of example charge-trapping memory cells in NAND strings.
Figure 4B:
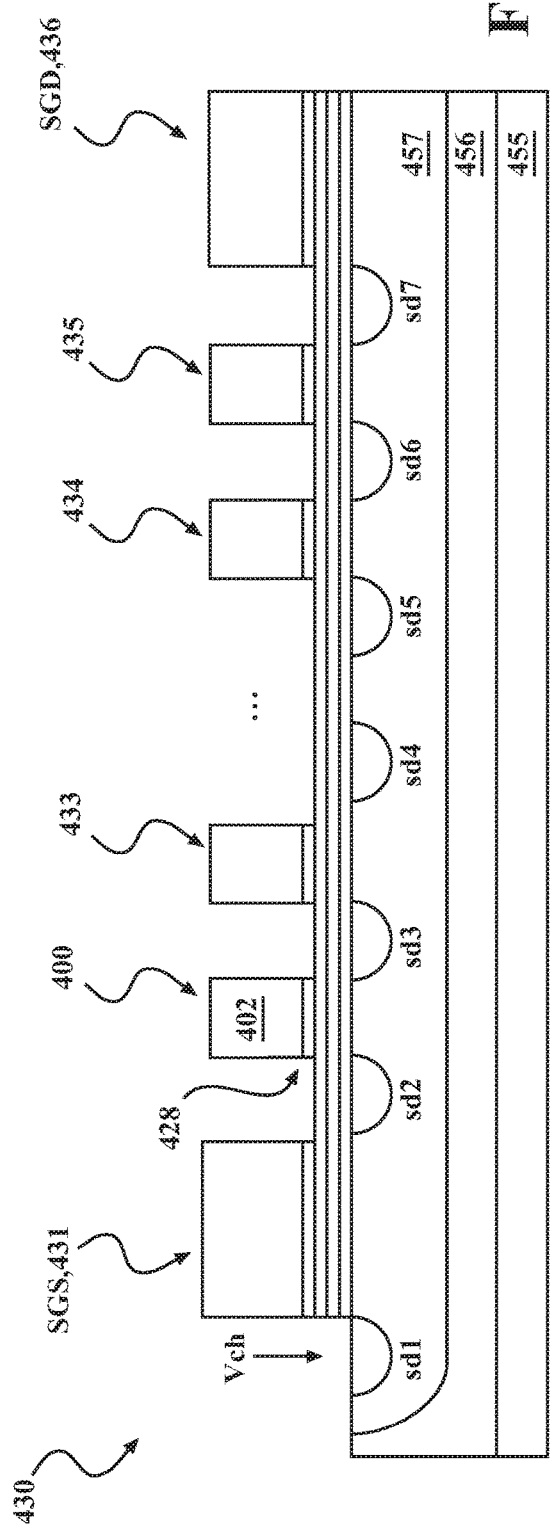
FIG. 4B depicts a cross-sectional view of the structure of FIG. 4A along line 429.

The control gate wraps around the floating gate, increasing the surface contact area between the control gate and floating gate. This results in higher IPD capacitance, leading to a higher coupling ratio which makes programming and erase easier. However, as NAND memory devices are scaled down, the spacing between neighboring cells becomes smaller so there is almost no space for the control gate and the IPD between two adjacent floating gates. As an alternative, as shown in FIGS. 4A and 4B, the flat or planar memory cell has been developed in which the control gate is flat or planar; that is, it does not wrap around the floating gate, and its only contact with the charge storage layer is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

Figure 3B:
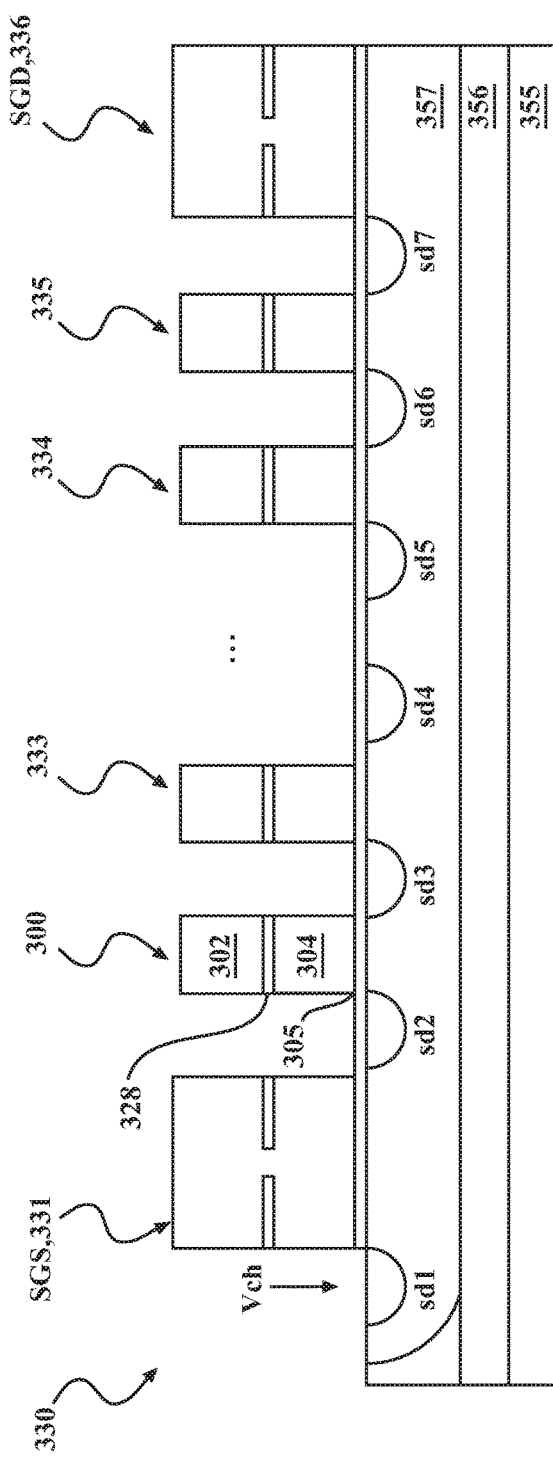
FIG. 3B depicts a cross-sectional view of the structure of FIG. 3A along line 329.

FIG. 3B depicts a cross-sectional view of the structure of FIG. 3A along line 329. The NAND string 330 includes an SGS transistor 331, example memory cells 300, 333, ..., 334 and 335, and an SGD transistor 336. The memory cell 300, as an example of each memory cell, includes the control gate 302, the IPD layer 328, the floating gate 304 and the tunnel oxide layer 305, consistent with FIG. 3A. Passageways in the IPD layer in the SGS and SGD transistors allow the control gate layers and floating gate layers to communicate. The control gate and floating gate layers may be polysilicon and the tunnel oxide layer may be silicon oxide, for instance. The IPD layer can be a stack of nitrides (N) and oxides (O) such as in a N-O-N-O-N configuration.

The NAND string may be formed on a substrate which comprises a p-type substrate region 355, an n-type well 356 and a p-type well 357. N-type source/drain diffusion regions sd1, sd2, sd3, sd4, sd5, sd6 and sd7 are formed in the p-type well. A channel voltage, Vch, may be applied directly to the channel region of the substrate.

FIG. 4A depicts a cross-sectional view of example charge-trapping memory cells in NAND strings. The view is in a word line direction of memory cells comprising a flat control gate and charge-trapping regions as a 2D example of memory cells in the memory cell array 126 of FIG. 1. Charge-trapping memory can be used in NOR and NAND flash memory device. This technology uses an insulator such as a SiN film to store electrons, in contrast to a floating-gate MOSFET technology which uses a conductor such as doped polycrystalline silicon to store electrons. As an example, a word line (WL) 424 extends across NAND strings which include respective channel regions 406, 416 and 426. Portions of the word line provide control gates 402, 412 and 422. Below the word line is an IPD layer 428, charge-trapping layers 404, 414 and 421, polysilicon layers 405, 415 and 425 and tunneling layer layers 409, 407 and 408. Each charge-trapping layer extends continuously in a respective NAND string.

A memory cell 400 includes the control gate 402, the charge-trapping layer 404, the polysilicon layer 405 and a portion of the channel region 406. A memory cell 410 includes the control gate 412, the charge-trapping layer 414, a polysilicon layer 415 and a portion of the channel region 416. A memory cell 420 includes the control gate 422, the charge-trapping layer 421, the polysilicon layer 425 and a portion of the channel region 426.

A flat control gate is used here instead of a control gate that wraps around a floating gate. One advantage is that the charge-trapping layer can be made thinner than a floating gate. Additionally, the memory cells can be placed closer together.

FIG. 4B depicts a cross-sectional view of the structure of FIG. 4A along line 429. The view shows a NAND string 430 having a flat control gate and a charge-trapping layer. The NAND string 430 includes an SGS transistor 431, example memory cells 400, 433, ..., 434 and 435, and an SGD transistor 435.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well 457. A channel voltage, Vch, may be applied directly to the channel region of the substrate. The memory cell 400 includes the control gate 402 and the IPD layer 428 above the charge-trapping layer 404, the polysilicon layer 405, the tunneling layer 409 and the channel region 406.

The control gate layer may be polysilicon and the tunneling layer may be silicon oxide, for instance. The IPD layer can be a stack of high-k dielectrics such as AlOx or HfOx which help increase the coupling ratio between the control gate layer and the charge-trapping or charge storing layer. The charge-trapping layer can be a mix of silicon nitride and oxide, for instance.

The SGD and SGS transistors have the same configuration as the memory cells but with a longer channel length to ensure that current is cutoff in an inhibited NAND string.

In this example, the layers 404, 405 and 409 extend continuously in the NAND string. In another approach, portions of the layers 404, 405 and 409 which are between the control gates 402, 412 and 422 can be removed, exposing a top surface of the channel 406.

Figure 5A:
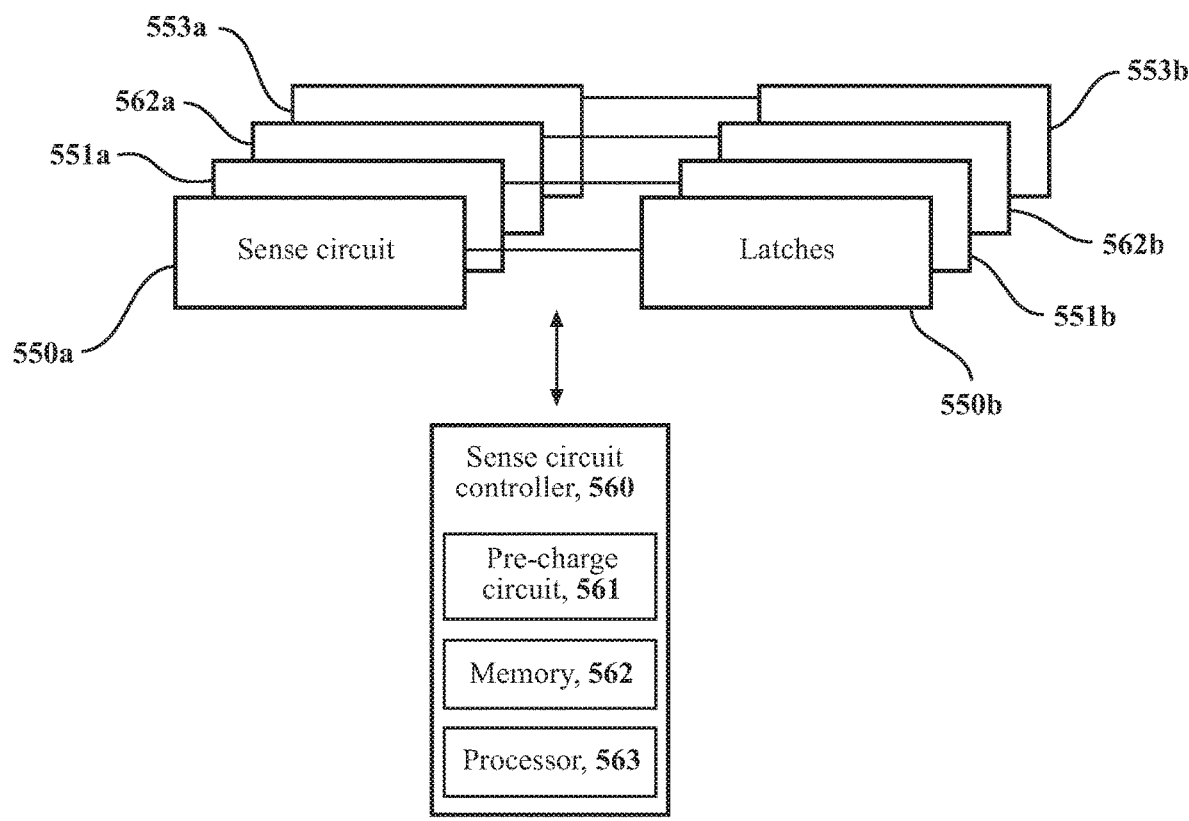
FIG. 5A depicts an example block diagram of the sense block SB1 of FIG. 1.

FIG. 5A depicts an example block diagram of the sense block SB1 of FIG. 1. In one approach, a sense block comprises multiple sense circuits. Each sense circuit is associated with data latches. For example, the example sense circuits 550a, 551a, 552a and 553a are associated with the data latches 550b, 551b, 552b and 553b, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller may include a pre-charge circuit 561 which provides a voltage to each sense circuit for setting a pre-charge voltage. In one possible approach, the voltage is provided to each sense circuit independently, e.g., via the data base 503 and a local bus such as LBUS1 or LBUS2 in FIG. 5B. In another possible approach, a common voltage is provided to each sense circuit concurrently, e.g., via the line 505 in FIG. 5B. The sense circuit controller may also include a memory 562 and a processor 563. As mentioned also in connection with FIG. 2, the memory 562 may store code which is executable by the processor to perform the functions described herein. These functions can include reading latches which are associated with the sense circuits, setting bit values in the latches and providing voltages for setting pre-charge levels in sense nodes of the sense circuits. Further example details of the sense circuit controller and the sense circuits 550a and 551a are provided below.

Figure 5B:
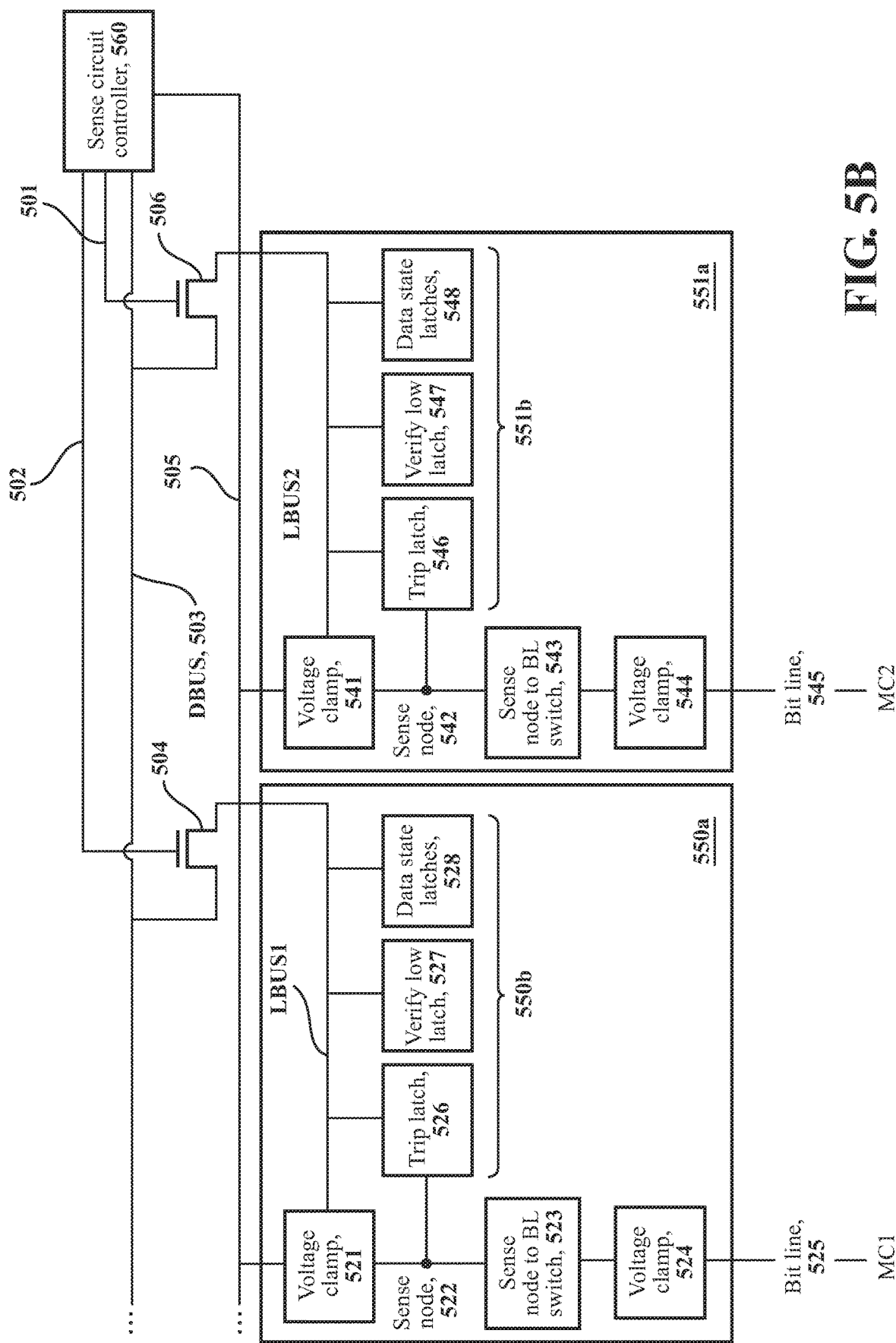
FIG. 5B depicts another example block diagram of the sense block SB1 of FIG. 1.

FIG. 5B depicts another example block diagram of the sense block SB1 of FIG. 1. The sense circuit controller 560 communicates with multiple sense circuits including example sense circuits 550a and 551a, also shown in FIG. 5A. The sense circuit 550a includes latches 550b, including a trip latch 526, an offset verify latch 527 and data state latches 528. The sense circuit further includes a voltage clamp 521 such as a transistor which sets a pre-charge voltage at a sense node 522. A sense node to bit line (BL) switch 523 selectively allows the sense node to communicate with a bit line 525, e.g., the sense node is electrically connected to the bit line so that the sense node voltage can decay. The bit line 525 is connected to one or more memory cells such as a memory cell MC1. A voltage clamp 524 can set a voltage on the bit line, such as during a sensing operation or during a program voltage. A local bus, LBUS1, allows the sense circuit controller to communicate with components in the sense circuit, such as the latches 550b and the voltage clamp in some cases. To communicate with the sense circuit 550a, the sense circuit controller provides a voltage via a line 502 to a transistor 504 to connect LBUS1 with a data bus DBUS, 503. The communicating can include sending data to the sense circuit and/or receive data from the sense circuit.

The sense circuit controller can communicate with different sense circuits in a time-multiplexed manner, for instance. A line 505 may be connected to the voltage clamp in each sense circuit, in one approach.

The sense circuit 551a includes latches 551b, including a trip latch 546, an offset verify latch 547 and data state latches 548. A voltage clamp 541 may be used to set a pre-charge voltage at a sense node 542. A sense node to bit line (BL) switch 543 selectively allows the sense node to communicate with a bit line 545, and a voltage clamp 544 can set a voltage on the bit line. The bit line 545 is connected to one or more memory cells such as a memory cell MC2. A local bus, LBUS2, allows the sense circuit controller to communicate with components in the sense circuit, such as the latches 551b and the voltage clamp in some cases. To communicate with the sense circuit 551a, the sense circuit controller provides a voltage via a line 501 to a transistor 506 to connect LBUS2 with DBUS.

The sense circuit 550a may be a first sense circuit which comprises a first trip latch 526 and the sense circuit 551a may be a second sense circuit which comprises a second trip latch 546.

The sense circuit 550a is an example of a first sense circuit comprising a first sense node 522, where the first sense circuit is associated with a first memory cell MC1 and a first bit line 525. The sense circuit 551a is an example of a second sense circuit comprising a second sense node 542, where the second sense circuit is associated with a second memory cell MC2 and a second bit line 545.

Figure 6A:
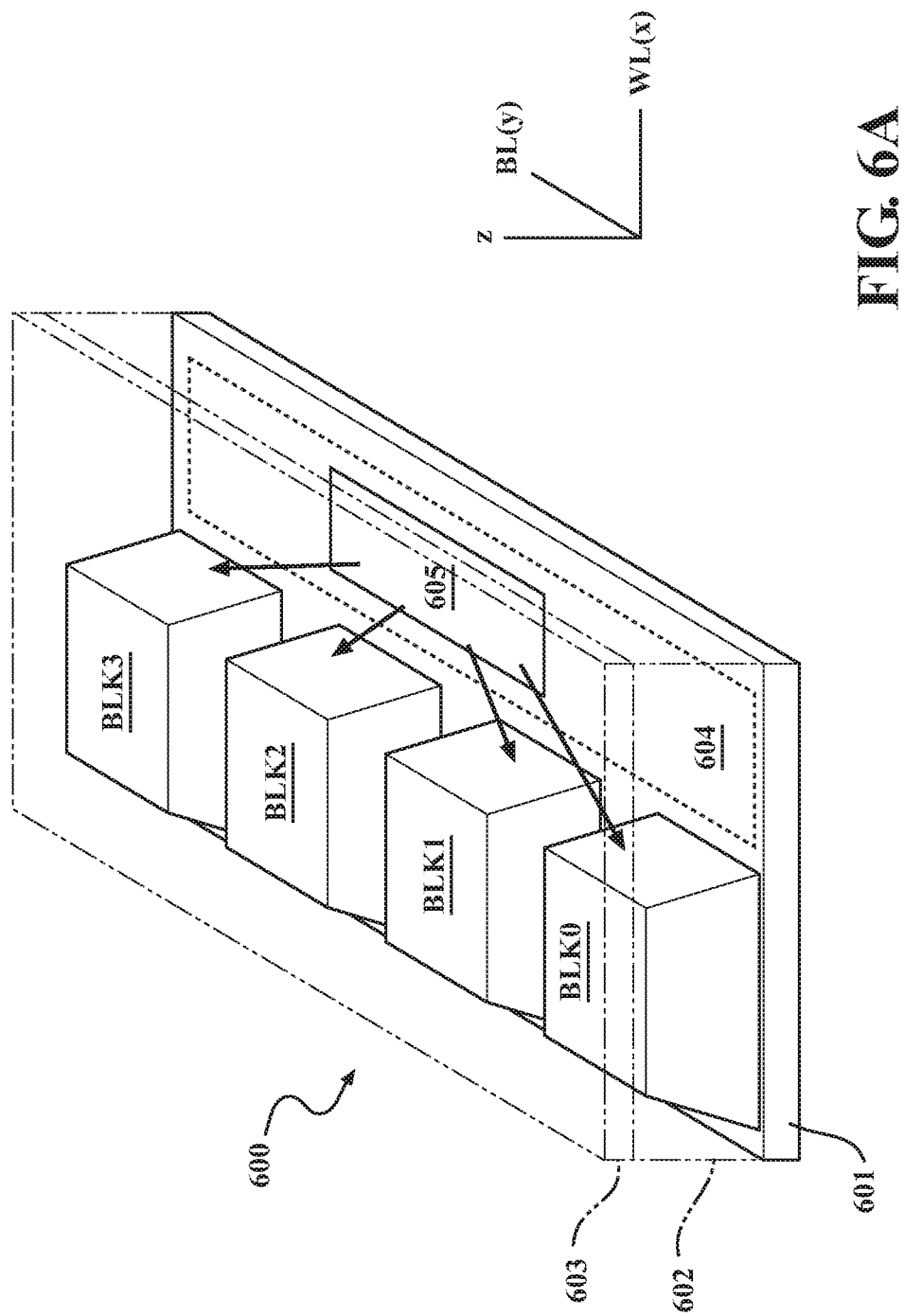
FIG. 6A is a perspective view of a set of blocks in an example three-dimensional configuration of the memory array of FIG. 1.

FIG. 6A is a perspective view of a set of blocks 600 in an example three-dimensional configuration of the memory array 126 of FIG. 1. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
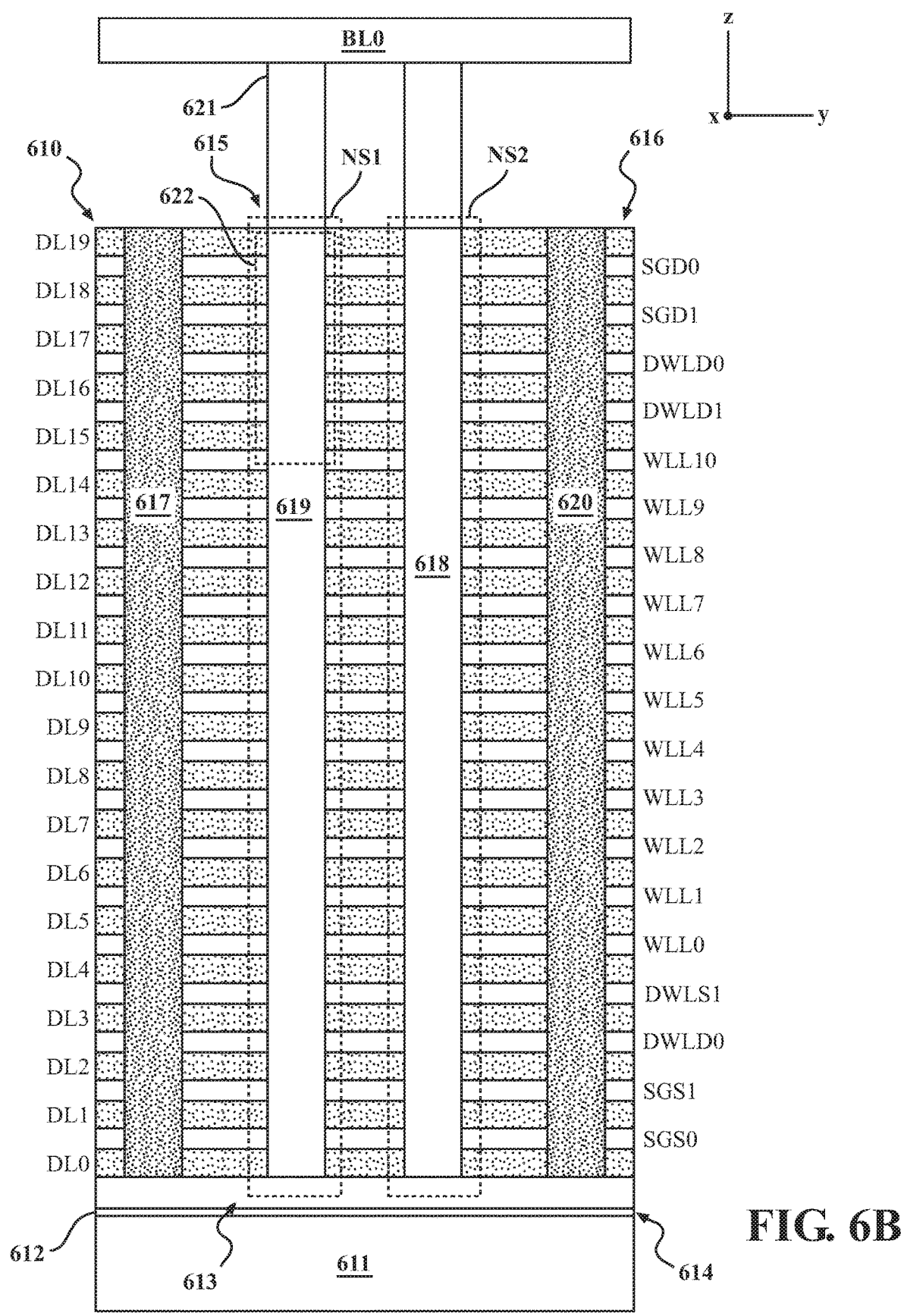
FIG. 6B depicts an example cross-sectional view of a portion of one of the blocks of FIG. 6A.

FIG. 6B depicts an example cross-sectional view of a portion of one of the blocks of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6D.

The stack includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

Figure 6C:
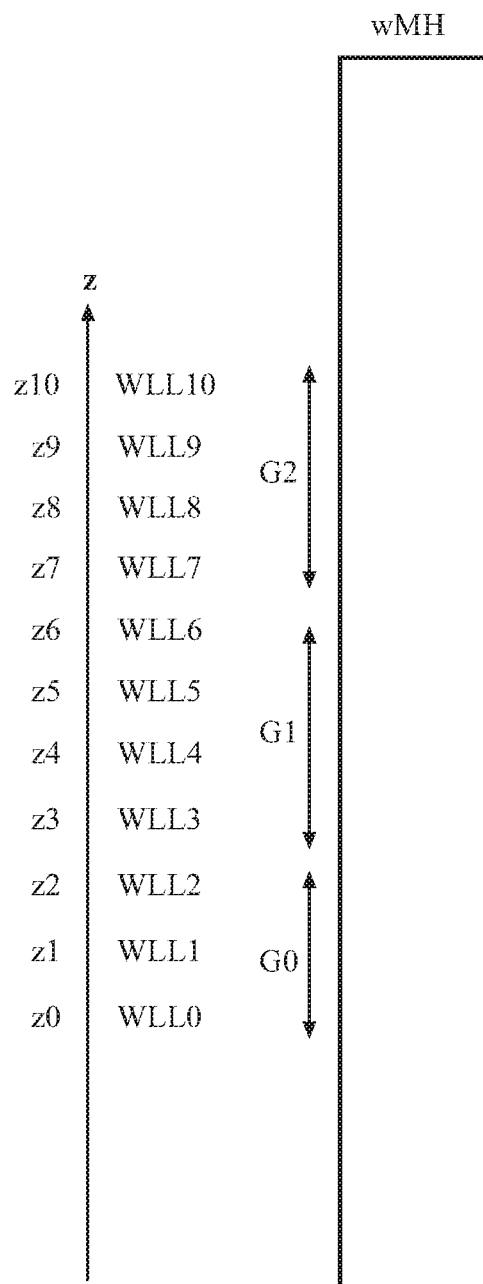
FIG. 6C depicts a plot of memory hole diameter in the stack of FIG. 6B.

FIG. 6C depicts a plot of memory hole diameter in the stack of FIG. 6B. The vertical axis is aligned with the stack of FIG. 6B and depicts a width (wMH), e.g., diameter, of the memory holes 618 and 619. The word line layers WLL0-WLL10 of FIG. 6A are repeated as an example and are at respective heights z0-z10 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 6D:
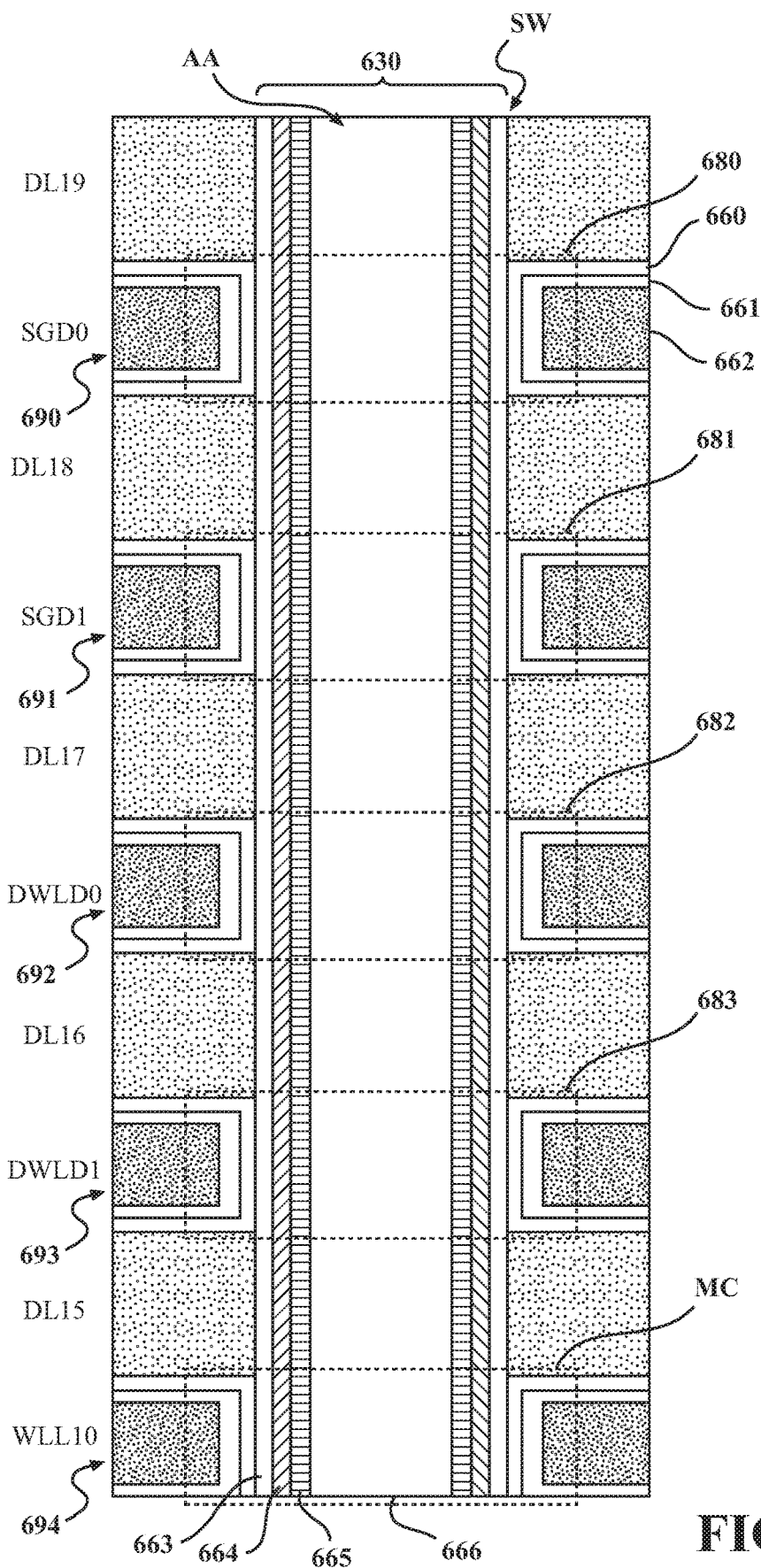
FIG. 6D depicts a close-up view of the region 622 of the stack of FIG. 6B.

FIG. 6D depicts a close-up view of the region 622 of the stack of FIG. 6B. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 7A:
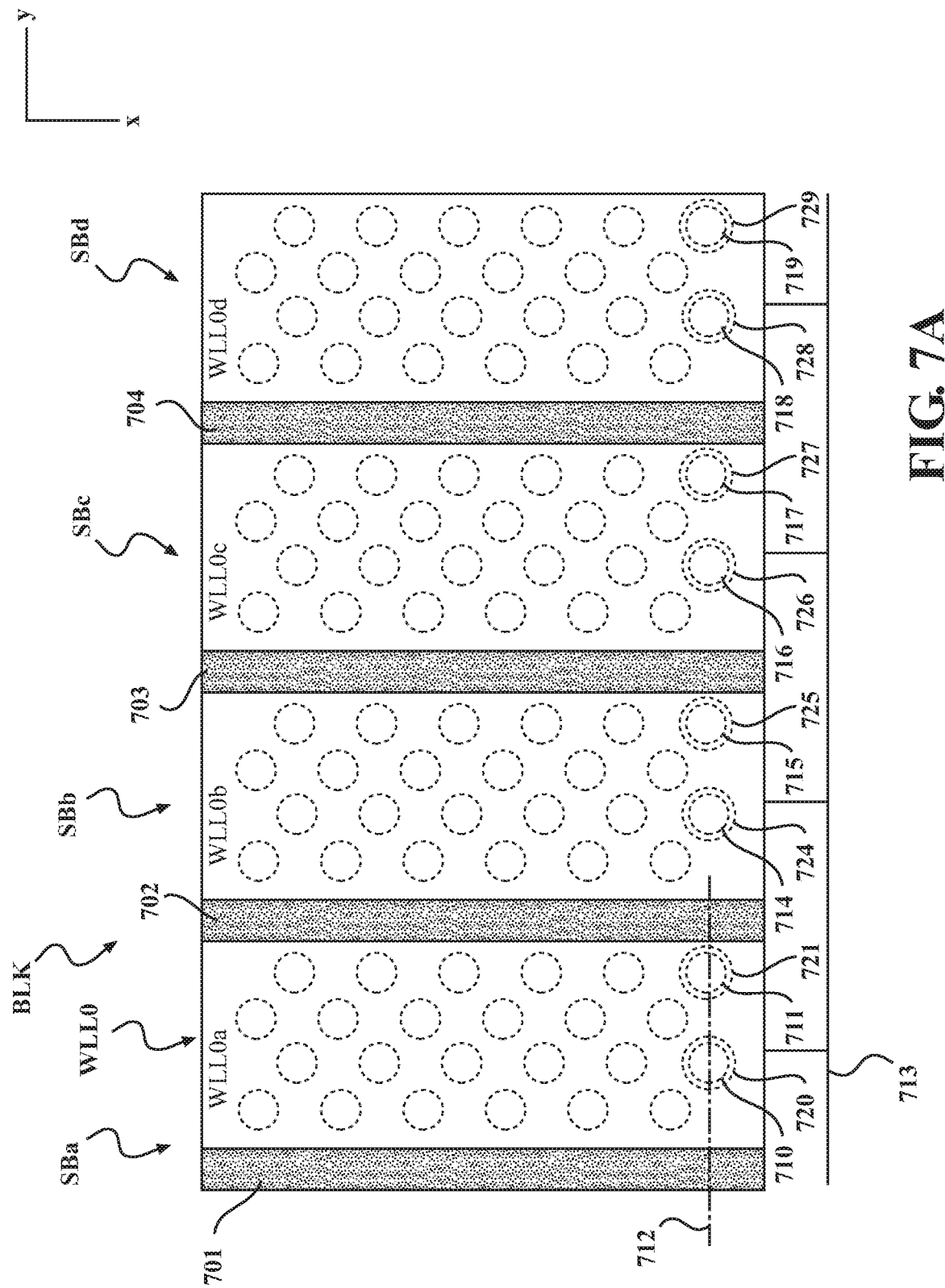
FIG. 7A depicts a top view of an example word line layer WLL0 of the stack of FIG. 6B.

FIG. 7A depicts a top view of an example word line layer WLL0 of the stack of FIG. 6B. As mentioned, a 3D memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a 3D memory device can be divided into sub-blocks, where each sub-block comprises a set of NAND string which have a common SGD control line. For example, see the SGD lines/control gates SGD0, SGD1, SGD2 and SGD3 in the sub-blocks SBa, SBb, SBc and SBd, respectively. The sub-blocks SBa, SBb, SBc and SBd may also be referred herein as a string of memory cells of a word line. As described, a string of memory cells of a word line may include a plurality of memory cells that are part of the same sub-block, and that are also disposed in the same word line layer and/or that are configured to have their control gates biased by the same word line and/or with the same word line voltage.

Further, a word line layer in a block can be divided into regions. Each region is in a respective sub-block are can extend between slits which are formed periodically in the stack to process the word line layers during the fabrication process of the memory device. This processing can include replacing a sacrificial material of the word line layers with metal. Generally, the distance between slits should be relatively small to account for a limit in the distance that an etchant can travel laterally to remove the sacrificial material, and that the metal can travel to fill a void which is created by the removal of the sacrificial material. For example, the distance between slits may allow for a few rows of memory holes between adjacent slits. The layout of the memory holes and slits should also account for a limit in the number of bit lines which can extend across the region while each bit line is connected to a different memory cell. After processing the word line layers, the slits can optionally be filed with metal to provide an interconnect through the stack.

This figure and other are not necessarily to scale. In practice, the regions can be much longer in the x-direction relative to the y-direction than is depicted to accommodate additional memory holes.

Figure 7B:
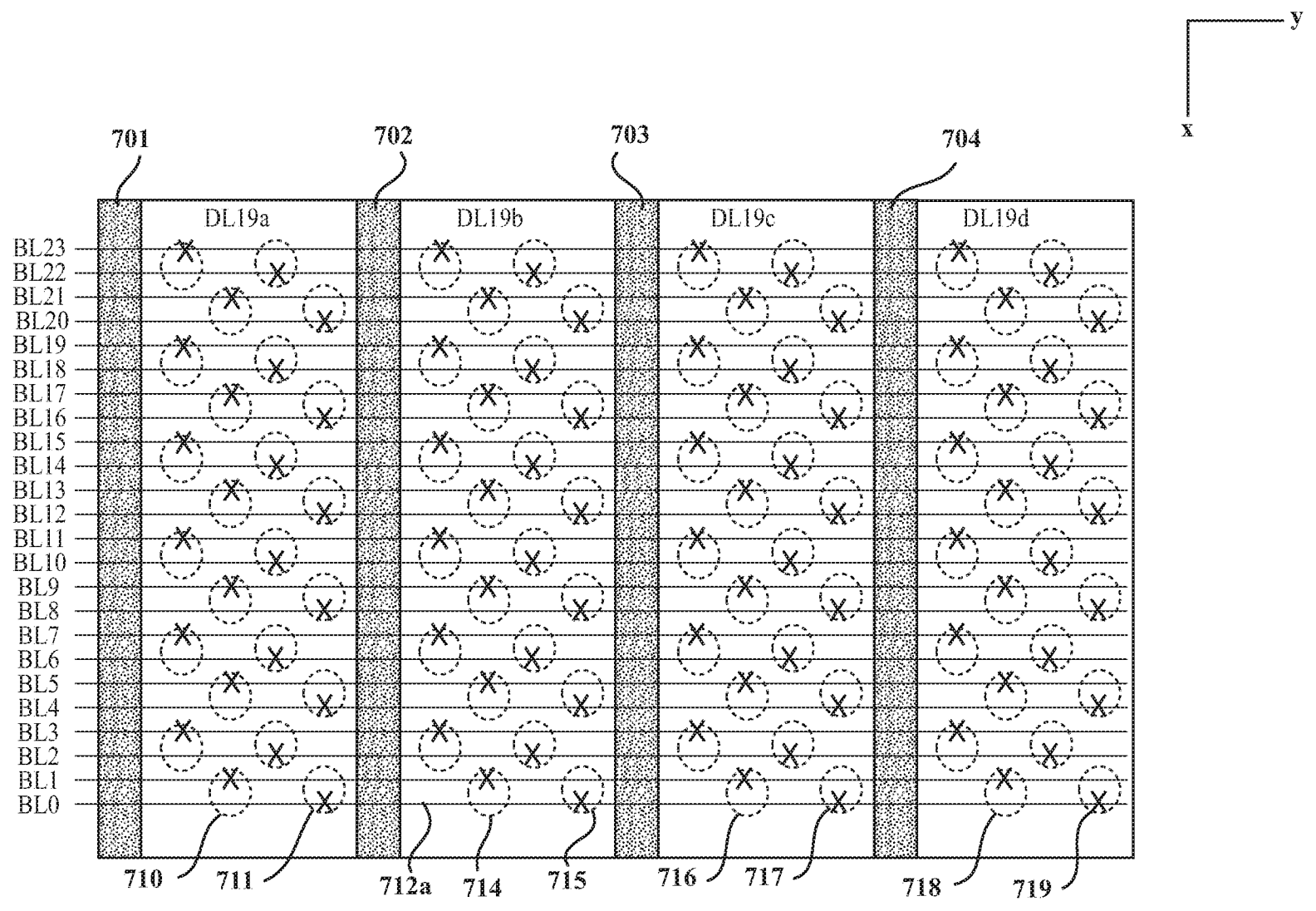

In this example, there are four rows of memory holes between adjacent slits. A row here is a group of memory holes which are aligned in the x-direction. Moreover, the rows of memory holes are in a staggered pattern to increase the density of the memory holes. The word line layer or word line is divided into regions WLL0 *a*, WLL0 *b*, WLL0 *c* and WLL0 *d* which are each connected by a connector 713. The last region of a word line layer in a block can be connected to a first region of a word line layer in a next block, in one approach. The connector, in turn, is connected to a voltage driver for the word line layer. The region WLL0 *a* has example memory holes 710 and 711 along a line 712. The region WLL0 *b* has example memory holes 714 and 715. The region WLL0 *c* has example memory holes 716 and 717. The region WLL0 *d* has example memory holes 718 and 719. The memory holes are also shown in FIG. 7B. Each memory hole can be part of a respective NAND string. For example, the memory holes 710, 714, 716 and 718 can be part of NAND strings NS0_SBa, NS0_SBb, NS0_SBc and NS0_SBd, respectively.

Each circle represents the cross-section of a memory hole at a word line layer or SG layer. Example circles shown with dashed lines represent memory cells which are provided by the materials in the memory hole and by the adjacent word line layer. For example, memory cells 720 and 721 are in WLL0 *a*, memory cells 724 and 725 are in WLL0 *b*, memory cells 726 and 727 are in WLL0 *c*, and memory cells 728 and 729 are in WLL0 *d*. These memory cells are at a common height in the stack.

Metal-filled slits 701, 702, 703 and 704 (e.g., metal interconnects) may be located between and adjacent to the edges of the regions WLL0 *a*-WLL0 *d*. The metal-filled slits provide a conductive path from the bottom of the stack to the top of the stack. For example, a source line at the bottom of the stack may be connected to a conductive line above the stack, where the conductive line is connected to a voltage driver in a peripheral region of the memory device. See also FIG. 8A for further details of the sub-blocks SBa-SBd of FIG. 7A.

FIG. 7B depicts a top view of an example top dielectric layer DL19 of the stack of FIG. 6B. The dielectric layer is divided into regions DL19 a, DL19 b, DL19 c and DL19 d. Each region can be connected to a respective voltage driver. This allows a set of memory cells in one region of a word line layer to be programmed concurrently, with each memory cell being in a respective NAND string which is connected to a respective bit line. A voltage can be set on each bit line to allow or inhibit programming during each program voltage.

The region DL19a has the example memory holes 710 and 711 along a line 712a which is coincident with a bit line BL0. A number of bit lines extend above the memory holes and are connected to the memory holes as indicated by the "X" symbols. BL0 is connected to a set of memory holes which includes the memory holes 711, 715, 717 and 719. Another example bit line BL1 is connected to a set of memory holes which includes the memory holes 710, 714, 716 and 718. The metal-filled slits 701, 702, 703 and 704 from FIG. 7A are also depicted, as they extend vertically through the stack. The bit lines can be numbered in a sequence BL0-BL23 across the DL19 layer in the −x direction.

Different subsets of bit lines are connected to cells in different rows. For example, BL0, BL4, BL8, BL12, BL16 and BL20 are connected to cells in a first row of cells at the right hand edge of each region. BL2, BL6, BL10, BL14, BL18 and BL22 are connected to cells in an adjacent row of cells, adjacent to the first row at the right hand edge. BL3, BL7, BL11, BL15, BL19 and BL23 are connected to cells in a first row of cells at the left hand edge of each region. BL1, BL5, BL9, BL13, BL17 and BL21 are connected to cells in an adjacent row of cells, adjacent to the first row at the left hand edge.

Figure 8A:
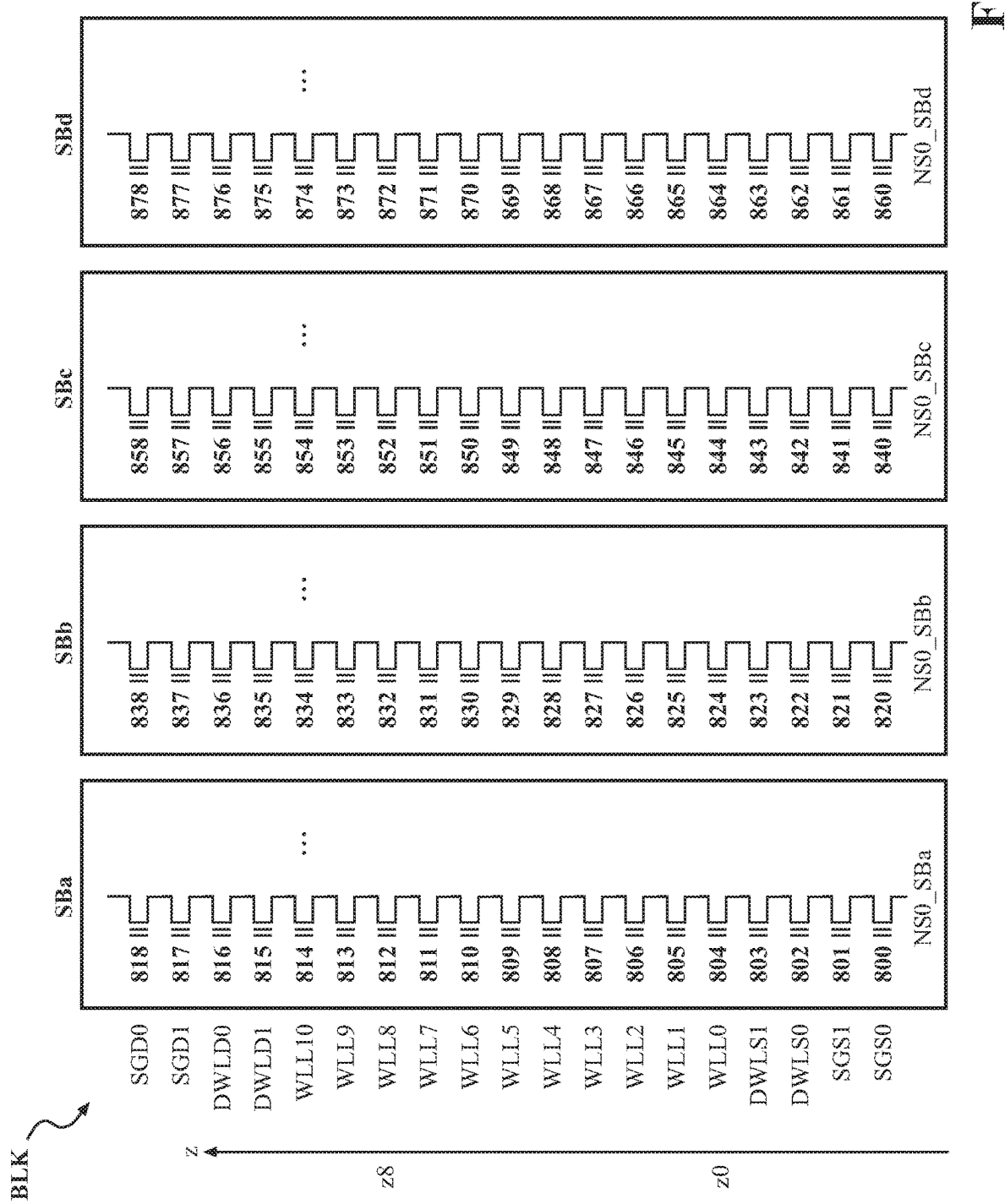
FIG. 8A depicts example NAND strings in the sub-blocks SBa-SBd of FIG. 7A.

FIG. 8A depicts example NAND strings in the sub-blocks SBa-SBd of FIG. 7A. The sub-blocks are consistent with the structure of FIG. 6B. The conductive layers in the stack are depicted for reference at the left hand side. Each sub-block includes multiple NAND strings, where one example NAND string is depicted. For example, SBa comprises an example NAND string NS0_SBa, SBb comprises an example NAND string NS0_SBb, SBc comprises an example NAND string NS0_SBc, and SBd comprises an example NAND string NS0_SBd.

Additionally, NS0_SBa include SGS transistors 800 and 801, dummy memory cells 802 and 803, data memory cells 804, 805, 806, 807, 808, 809, 810, 811, 812, 813 and 814, dummy memory cells 815 and 816, and SGD transistors 817 and 818.

NS0_SBb include SGS transistors 820 and 821, dummy memory cells 822 and 823, data memory cells 824, 825, 826, 827, 828, 829, 830, 831, 832, 833 and 834, dummy memory cells 835 and 836, and SGD transistors 837 and 838.

NS0_SBc include SGS transistors 840 and 841, dummy memory cells 842 and 843, data memory cells 844, 845, 846, 847, 848, 849, 850, 851, 852, 853 and 854, dummy memory cells 855 and 856, and SGD transistors 857 and 858.

NS0_SBd include SGS transistors 860 and 861, dummy memory cells 862 and 863, data memory cells 864, 865, 866, 867, 868, 869, 870, 871, 872, 873 and 874, dummy memory cells 875 and 876, and SGD transistors 877 and 878.

At a given height in the block, a set of memory cells in each sub-block are at a common height. For example, one set of memory cells (including the memory cell 804) is among a plurality of memory cells formed along tapered memory holes in a stack of alternating conductive and dielectric layers. The one set of memory cells is at a particular height z0 in the stack. Another set of memory cells (including the memory cell 824) connected to the one word line (WLL0) are also at the particular height. In another approach, the set of memory cells (e.g., including the memory cell 812) connected to another word line (e.g., WLL8) are at another height (z8) in the stack.

Figure 8B:
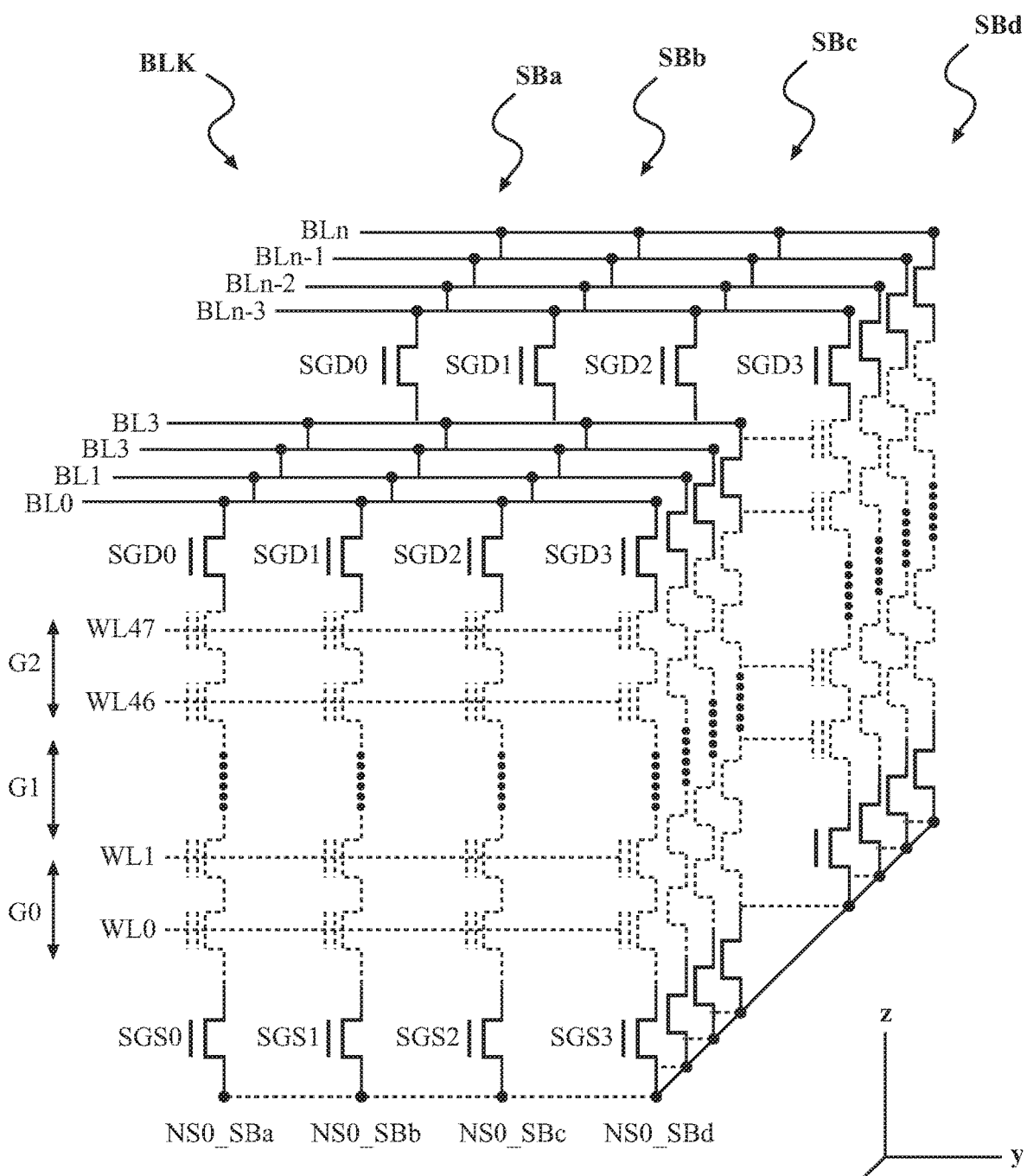
FIG. 8B depicts another example view of NAND strings in sub-blocks.

FIG. 8B depicts another example view of NAND strings in sub-blocks. The NAND strings includes NS0_SBa, NS0_SBb, NS0_SBc and NS0_SBd, which have 48 word lines, WL0-WL47, in this example. Each sub-block comprises a set of NAND strings which extend in the x direction and which have a common SGD line, e.g., SGD0, SGD1, SGD2 or SGD3. In this simplified example, there is only one SGD transistor and one SGS transistor in each NAND string. The NAND strings NS0_SBa, NS0_SBb, NS0_SBc and NS0_SBd are in sub-blocks SBa, SBb, SBc and SBd, respectively. Further, example, groups of word lines G0, G1 and G2 are depicted.

Figure 8C:
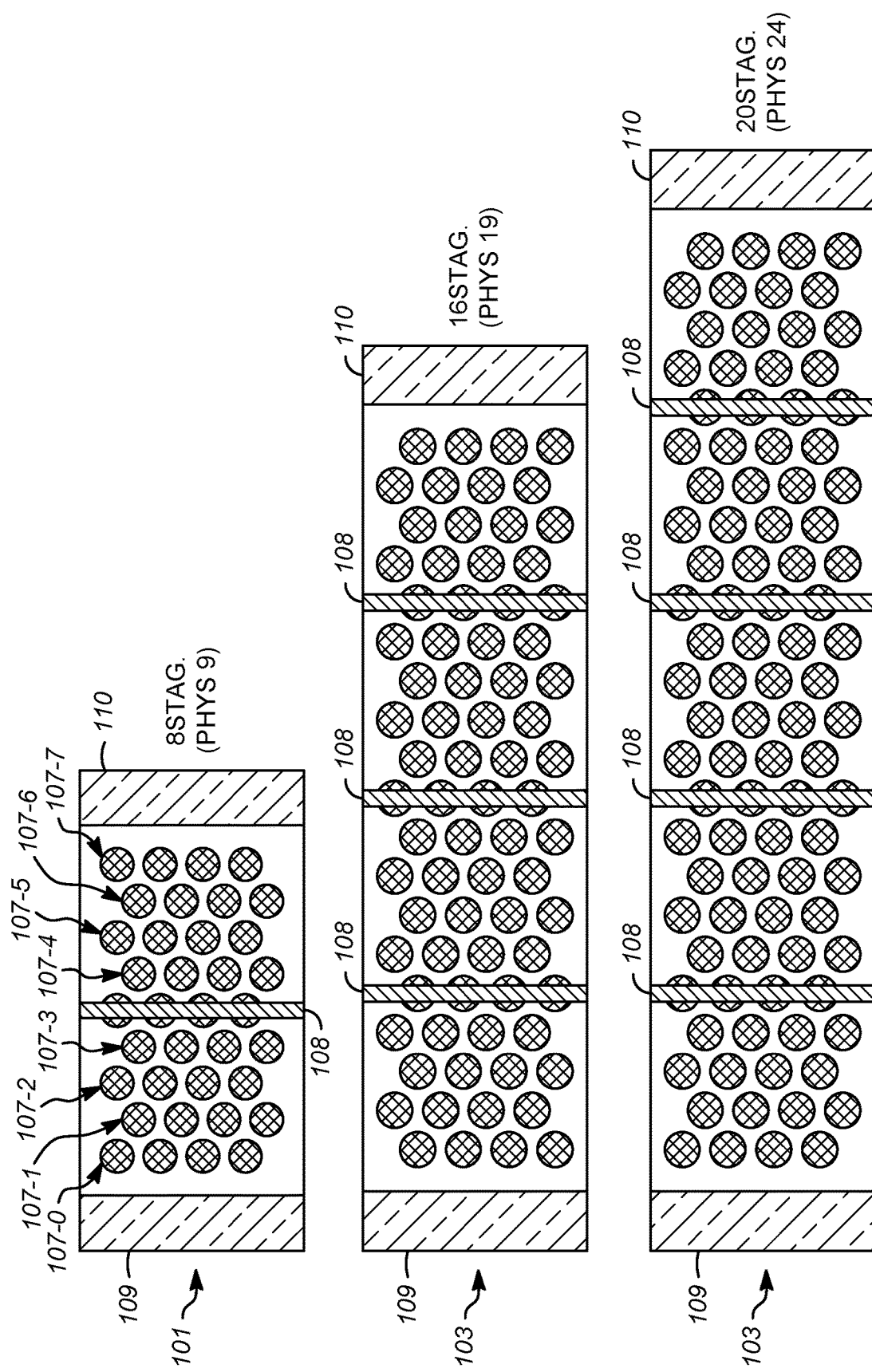
FIG. 8C depicts a top view of example word line layers of a stack.

FIG. 8C generally illustrates a schematic view of three versions of staggered string architecture 101, 103, 105 for BiCS memory, e.g., NAND. With reference the string architecture 101, the strings are shown in rows 107-0 through 107-7 in architecture 101. Each row is shown with four ends to the strings. A string may be connected to an adjacent string at an end (not visible beneath this view). A first group of rows 107-0 through 107-3 are shown on a left side of a dummy row 108. A second group of rows 107-4 through 107-7 are shown on a right side of the dummy row 108. The dummy row 108 separates the two groups of rows in the staggered eight rows. A source line 109 is positioned at an edge of the first group and is remote from the dummy row 108. A source line 110 is positioned at an edge of the second group and is remote from the dummy row 108 and source line 109.

The staggered string architectures 103, 105 for BiCS memory are similar to that of architecture 101 except additional groups are added. Architecture 103 is double the size of architecture 101 and includes sixteen rows of strings with each group of four rows separated by a dummy row. Architecture 105 is larger than both the architecture 101 and the architecture 103. Architecture 105 includes twenty rows of strings with each group of four rows separated by a dummy row 108.

These architectures 101, 103, 105 can include a chip under array structure, e.g., the control circuitry is under the memory array that can include the groups of memory strings. With the chip under array structure, the strings may include a direct strap contact for the source line for read and erase operations.

Figure 12:
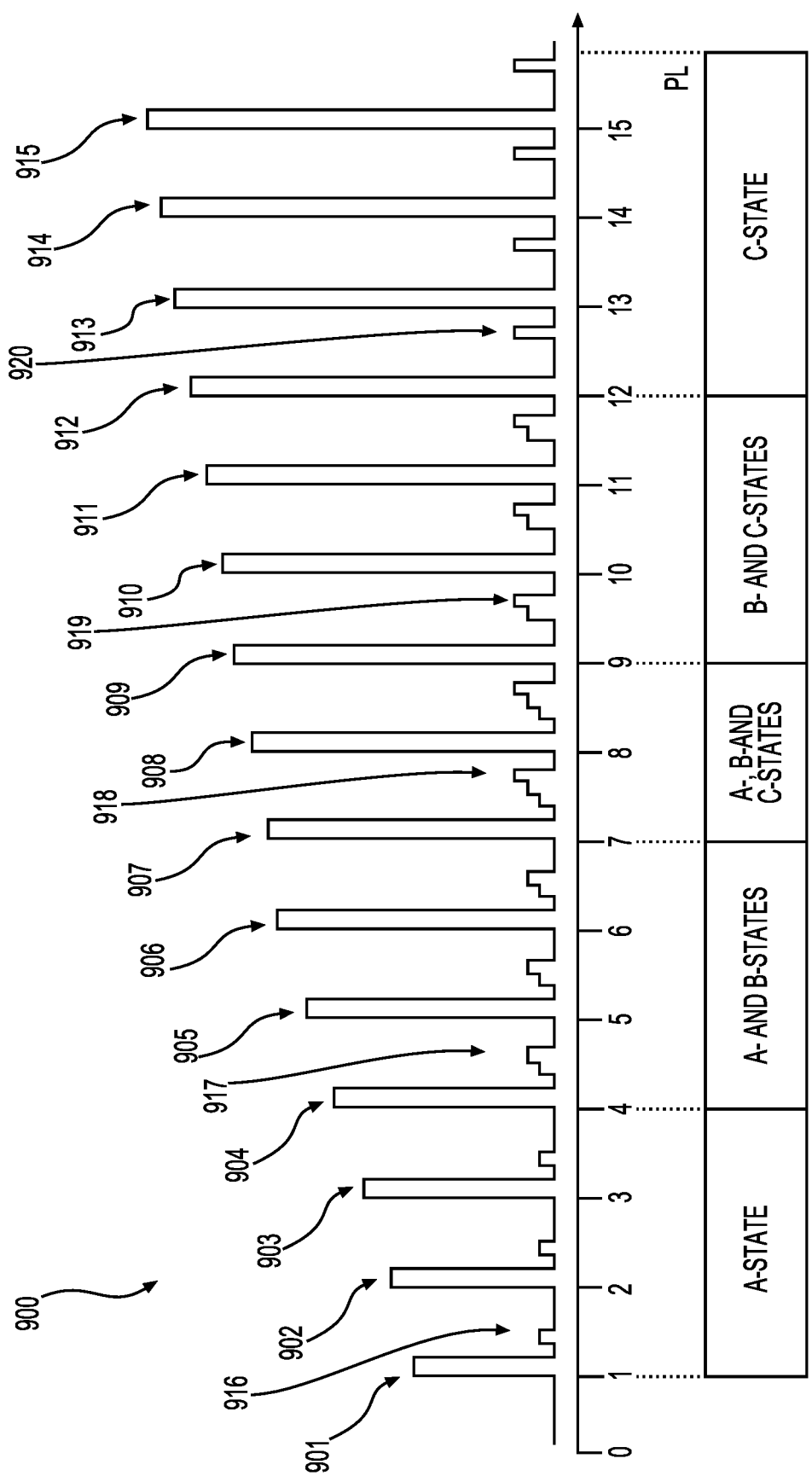
FIG. 12 is a flowchart of an example programming operation in a memory device.

FIG. 12 depicts a waveform of an example programming operation. The horizontal axis depicts a program loop number and the vertical axis depicts control gate or word line voltage. Generally, a programming operation can involve applying a pulse train to a selected word line, where the pulse train includes multiple program loops or program-verify (PV) iterations. The program portion of the program-verify iteration comprises a program voltage, and the verify portion of the program-verify iteration comprises one or more verify voltages.

For each program voltage, a square waveform is depicted for simplicity, although other shapes are possible such as a multilevel shape or a ramped shape. Further, Incremental Step Pulse Programming (ISPP) is used in this example, in which the program voltage steps up in each successive program loop. This example uses ISPP in a single programming stage in which the programming is completed. ISPP can also be used in each programming stage of a multi-stage operation.

A pulse train typically includes program voltages which increase stepwise in amplitude in each program-verify iteration using a fixed of varying step size. A new pulse train can be applied in each programming stage of a multi-stage programming operation, starting at an initial Vpgm level and ending at a final Vpgm level which does not exceed a maximum allowed level. The initial Vpgm levels can be the same or different in different programming stages. The final Vpgm levels can also be the same or different in different programming stages. The step size can be the same or different in the different programming stages. In some cases, a smaller step size is used in a final programming stage to reduce Vth distribution widths.

The pulse train 900 includes a series of program voltages 901, 902, 903, 904, 905, 906, 907, 908, 909, 910, 911, 912, 913, 914 and 915 that are applied to a word line selected for programming, and an associated set of non-volatile memory cells. One, two or three verify voltages are provided after each program voltage as an example, based on the target data states which are being verified. 0 V may be applied to the selected word line between the program and verify voltages. For example, an A-state verify voltage of VvA (e.g., waveform or programming signal 916) may be applied after each of the first, second and third program voltages 901, 902 and 903, respectively. A- and B-state verify voltages of VvA and VvB (e.g., programming signal 917) may be applied after each of the fourth, fifth and sixth program voltages 904, 905 and 906, respectively. A-, B- and C-state verify voltages of VvA, VvB and VvC (e.g., programming signal 918) may be applied after each of the seventh and eighth program voltages 907 and 908, respectively. B- and C-state verify voltages of VvB and VvC (e.g., programming signal 919) may be applied after each of the ninth, tenth and eleventh program voltages 909, 910 and 911, respectively. Finally, a C-state verify voltage of VvC (e.g., programming signal 1020) may be applied after each of the twelfth, thirteenth, fourteenth and fifteenth program voltages 912, 913, 914 and 915, respectively.

FIGS. 13A and 13B show threshold voltage (Vth) distributions of memory cells in an example two-stage programming operation. Specifically, the memory cells are initially in the erased state (bits 11) as represented by the Vth distribution 1100 shown in FIG. 13A. FIG. 13B depicts Vth distributions of memory cells after a first programming stage and a second programming stage of the example two-stage programming operation with four data states. While two programming stages and four data states are shown, it should be appreciated that any number of programming stages may be utilized (e.g., three or four programming stages) and any number of data states are contemplated.

In the example, the first programming stage causes the Vth of the A, B and C state cells to reach the Vth distributions 1002a, 1004a and 1006a, using first verify voltages of VvAf, VvBf and VvCf, respectively. This first programming stage can be a rough programming which uses a relatively large step size, for instance, so that the Vth distributions 1002a, 1004a and 1006a are relatively wide. The second programming stage may use a smaller step size and causes the Vth distributions 1002a, 1004a and 1006a to transition to the final Vth distributions 1002, 1004 and 1006 (e.g., narrower than Vth distributions 1002a, 1004a and 1006a), using second verify voltages of VvA, VvB, and VvC, respectively. This two-stage programming operation can achieve relatively narrow Vth distributions. A small number of A, B and C state cells (e.g., smaller than a predetermined number of the plurality of memory cells) may have a Vth which is below VvA, VvB or VvC, respectively, due to a bit ignore criteria.

Figures 14A, 14B:
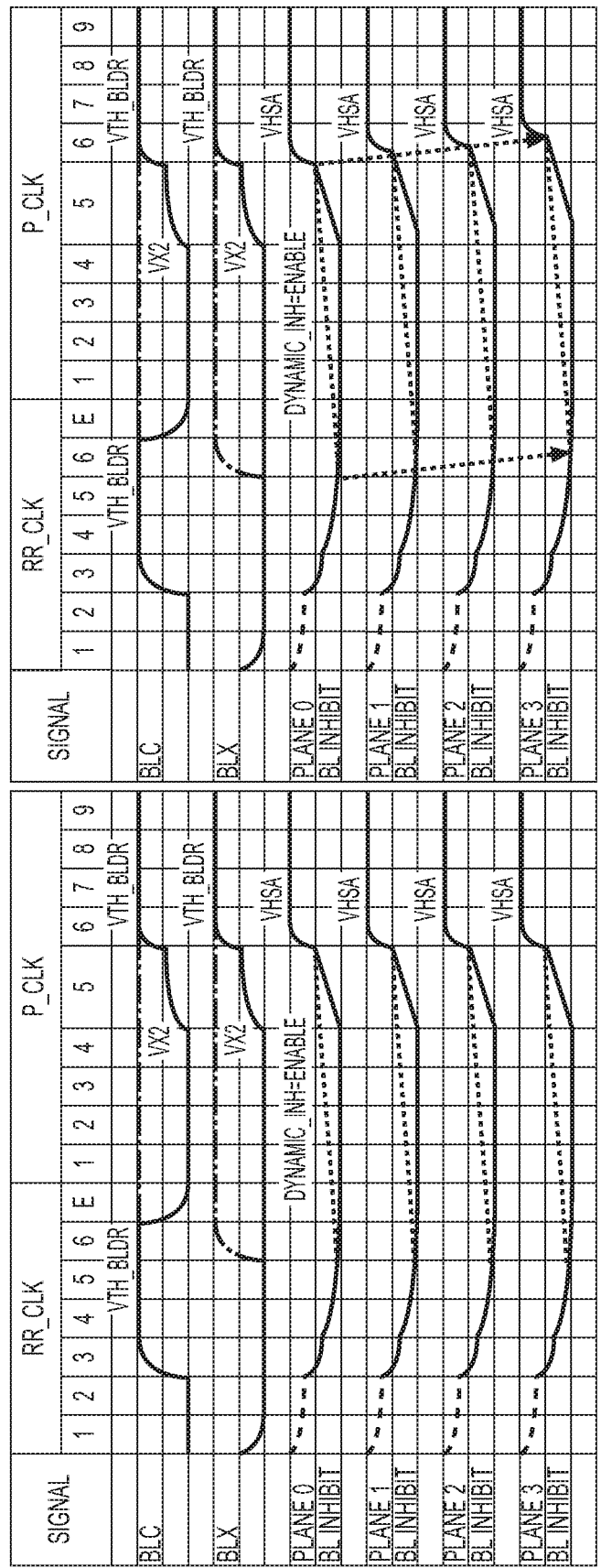
FIGS. 14A, 14B, 14C, and 14D depicts an example signal timing diagrams of inhibit bit line ramping events during a program loop of a program operation.
Figures 14C, 14D:
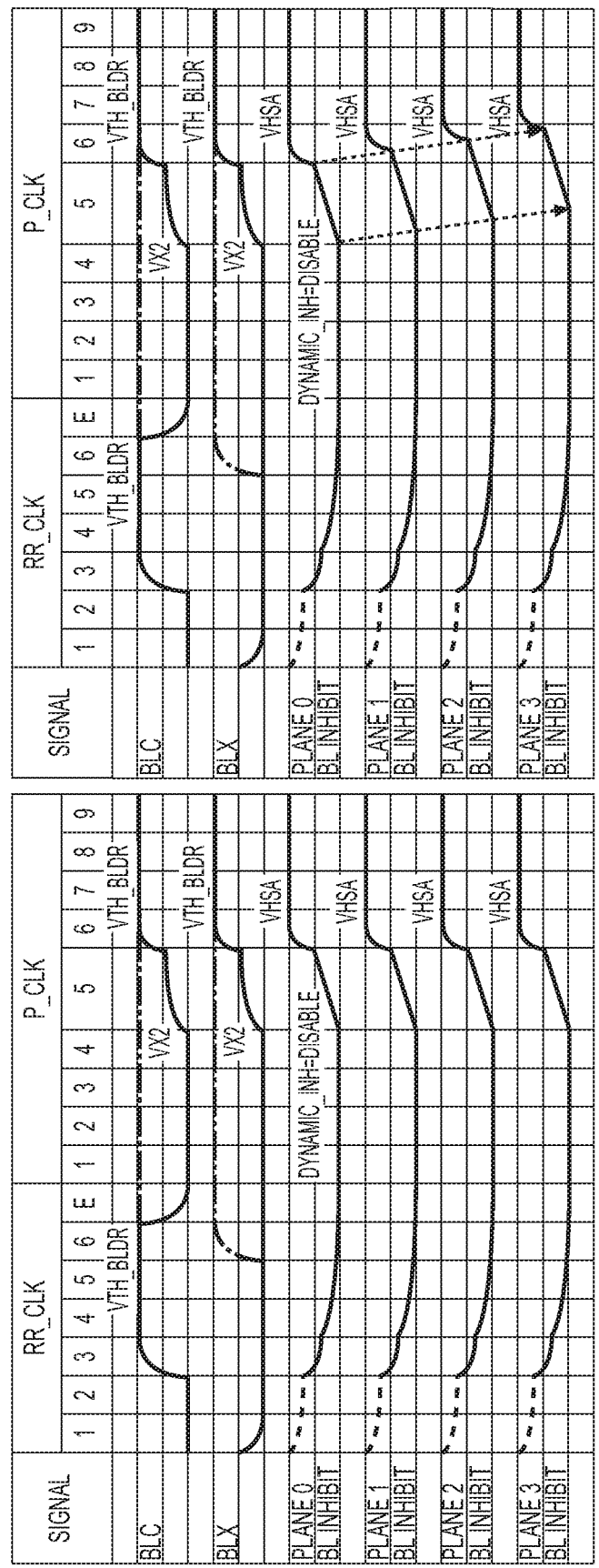

As described, in current flash memory design, one of the most challenging issues is reducing peak current consumption. Embodiments described herein provide an approach for reducing peak ICC in flash memory. In particular, embodiments described herein are directed to implementation of a plane skew methodology. To help further illustrate, FIGS. 14A, 14B, 14C, and 14D will now be described. FIGS. 14A, 14B, 14C, and 14D are signal timing diagrams of inhibit bit line ramping events during a program loop of a program operation. FIGS. 14B and 14D depict the implementation of the plane skew methodology disclosed herein.

As previously described, a memory device (e.g., memory device 100 in FIG. 1A) may include one or more memory die (e.g., memory die 108 in FIG. 1A). Each of the one or more memory die may include an array of memory cells organized into multiple planes. FIGS. FIGS. 14A, 14B, 14C, and 14D depict inhibit bit line ramping events for such planes 0, 1, 2, and 3 but a greater number of planes, such as eight or sixteen planes, may instead exist in a die of a memory device.

During a program loop, bit lines coupled to memory cells that will not be programmed are ramped up to a state designating program inhibit (e.g., Vdd), whereas bit lines that will be programmed remain at 0V. Conventionally, during a program loop for a program operation, inhibit bit line ramping events for all planes are initiated at the same time. For example, in FIG. 14A, BLC and BLX are control signals and are transistors that may be used to pass voltage (e.g., Vdd) from a sense circuit (e.g., 550a, 551a, 552a and 553a in FIG. 5A) to the bit line. In particular, the signal timing diagram in FIG. 14A depicts voltages of inhibited bit lines for planes 0, 1, 2, and 3 and voltages of the BLC and BLX transistors. As shown in FIG. 14A, inhibit bit line ramping events for planes 0, 1, 2, and 3 initiate simultaneously at the beginning of clock (CLK) cycle RR6 (e.g., when a DYNAMIC_INH parameter is enabled). Otherwise, as shown in FIG. 14C, inhibit bit line ramping events for planes 0, 1, 2, and 3 may initiate simultaneously at the beginning of CLK cycle P5.

In contrast, the signal timing diagrams in 14B and 14D depict voltages of inhibited bit lines for planes 0, 1, 2, and 3 and voltages of the BLC and BLX transistors when implementing the plane skew methodology for a program loop of a program operation. As shown in FIG. 14B, inhibit bit line ramping events for planes 0, 1, 2, and 3 may initiate ramping at different times after the beginning of CLK cycle RR6 (e.g., when a DYNAMIC_INH parameter is enabled) or as shown in FIG. 14D, after the beginning of CLK cycle P5. In some embodiments, inhibit bit line ramping events for planes 0, 1, 2, and 3 may have different ramping start time delays, which may cause inhibit bit line ramping for planes 1, 2, and 3 to start at different times after inhibit bit line ramping for plane 0 has started. As further shown in FIGS. 14B and 14D, signals for inhibited bit lines for planes 0, 1, 2, and 3 realign at the end of CLK cycle P6 or at the beginning of CLK cycle P7. The staggering of the inhibit bit line ramping at each plane helps reduce peak ICC. However, the realignment helps reduce the amount of circuitry needed to be reproduced for each plane. The more CLK cycles that the plane skew methodology is implemented in, the more circuitry that will be duplicated for each plane to control the ramping of the inhibit bit line.

As such, if signal DYNAMIC_INH is enable, the plane skew methodology described herein starts from RR6 CLK cycle. If signal DYNAMIC_INH is disable, the plane skew methodology is applied on P5 CLK cycle. A program loop of a program operation includes the following stages: P_CLK, PD_CLK, PR_CLK, R_CLK, RWL_CLK, and RR_CLK. P_CLK includes bit line and word line voltage ramping. During PD, the signal is plateaued. During PR_CLK, selective word lines ramp down and unselected word lines ramp to Vpass. In addition, R_CLK includes lower state verify and RWL_CLK includes higher state verify in the same program loop. RWL_CLK may be skipped if a higher state verify was not triggered from a previous bit-scan result. In the RR_CLK, word line voltages are brought back to ground to be prepared for the next program loop. RR_CLK is also where bit-scan operation happens. Therefore, DYNAMIC_INH enable or disable differentiate when inhibit bit line starts to ramp up, right after bit-scan in RR4_CLK cycle or in P5_CLK cycle. Starting right after bit-scan can reduce Tprog (for better performance) but in the case that RR4_CLK cycle is set too short, bit-scan operation and inhibit bit line ramping can overlap and result in higher peak ICC.

Figure 15:
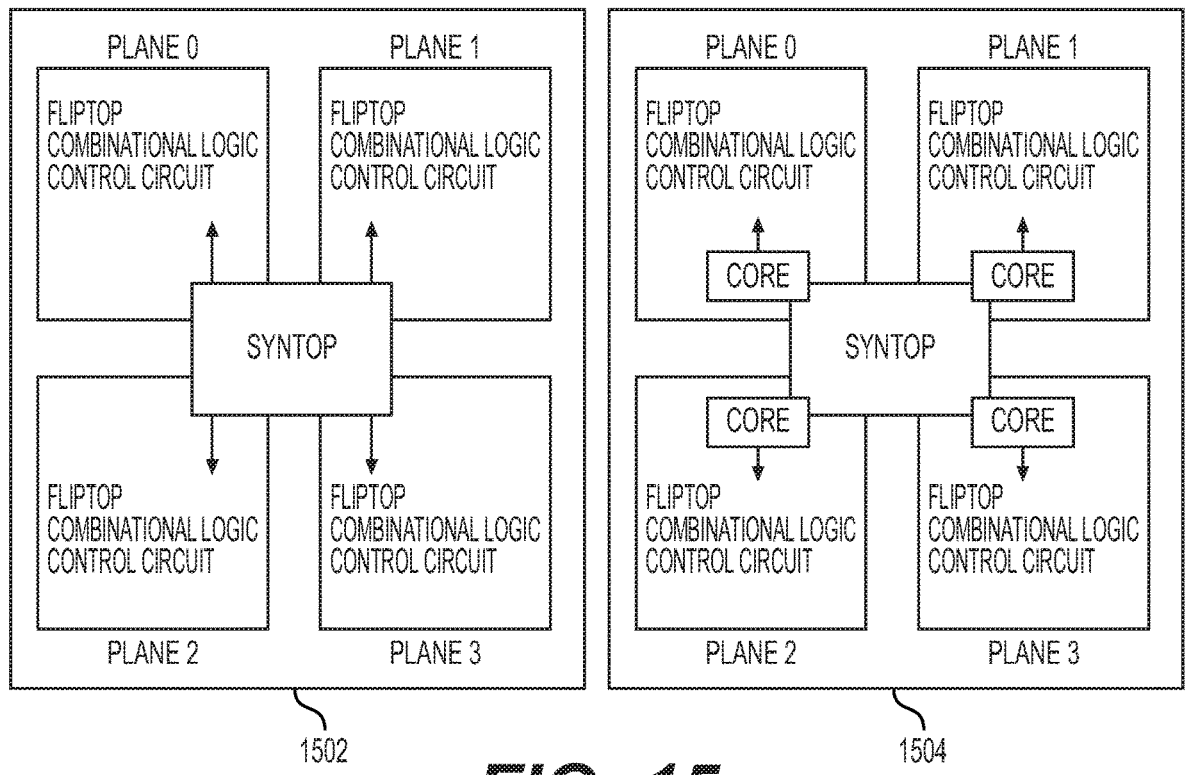
FIG. 15 conceptually illustrates a multiple plane arrangement showing four planes of memory cells on a single die.

FIG. 15 conceptually illustrates a multiple plane arrangement showing four planes of memory cells on a single die (e.g., die 108 in FIG. 1A) of a memory device (e.g., memory device 100 in FIG. 1A). In FIG. 15, a die 1502 and a die 1504 includes an array of memory cells organized into planes 0, 1, 2, and 3. However, in other embodiments, a greater number of planes, such as eight or sixteen planes, may exist in a single memory die. As illustrated in FIG. 15, implementation of the plane skew methodology may require reproduction of a circuitry (e.g., including flip-flop, combinational logic, and a control circuit technology) for each plane (which can be designed either in SYNTOP array as in memory die 1502 or core array as in memory die 1504).

Figure 16:
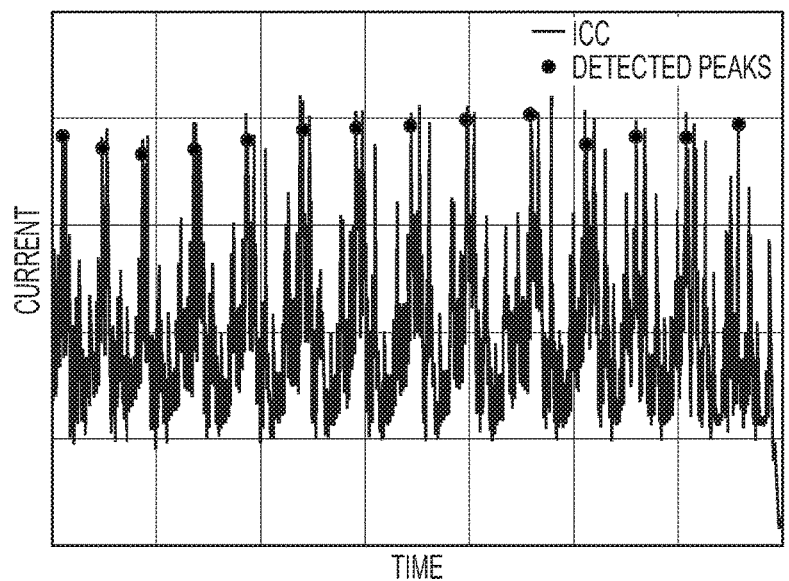
FIG. 16 illustrates ICC spectrum for a program operation including multiple program loops.

FIG. 16 illustrates an ICC spectrum for a program operation including multiple program loops. In FIG. 16, peak ICC detected for each program loop of the program operation is represented by dots. During emulation, peak ICC for each program loop of the program operation was observed to occur when inhibit bit lines start to ramp up. As such, the staggering of when inhibit bit lines start to ramp up at each plane helps prevent peaks in each plane from occurring at the same time. As further observed during emulation, and as shown in FIG. 16, peak ICC is mostly likely to occur in the middle of the program operation. As such, and because there is a performance penalty (e.g., Tprog increases) in implementing the plane skew methodology for each loop of a program operation, the plane skew methodology may be implemented only in a range of the middle program loops (e.g., for program loops 5 to 9 of a program operation including 13 program loops) to compromise between peak ICC reduction and the timing penalty.

Figure 17:
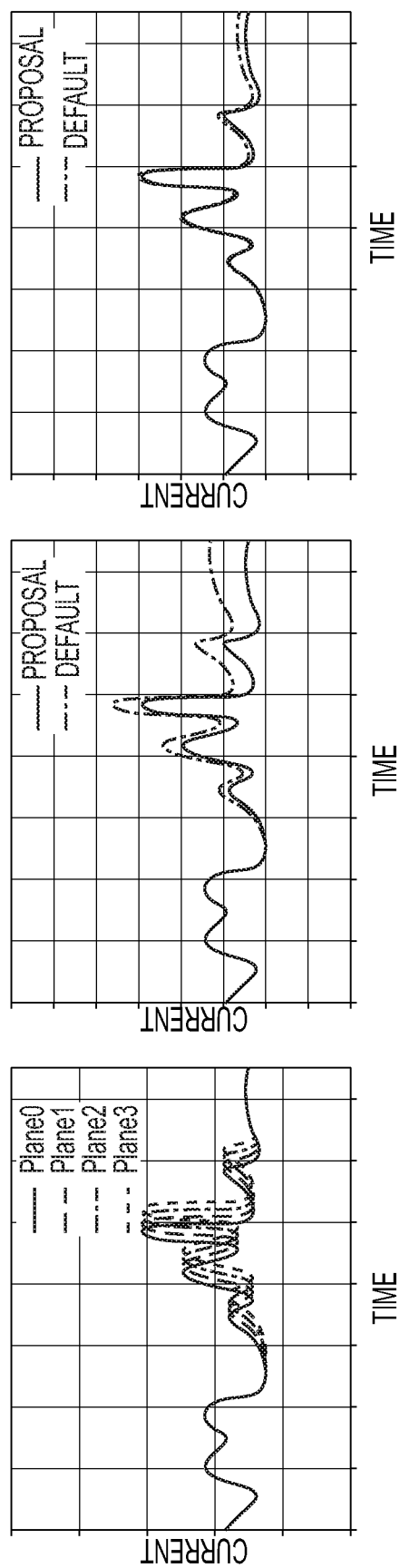
FIG. 17 provides different plots illustrating the implementation of the plane skew methodology, in accordance with embodiments described herein.

The left plot of FIG. 17 shows the implementation of the plane skew methodology for a first program loop of a program operation. In the left plot of FIG. 17, the peaks in each plane are staggered and do not occur simultaneously. The middle and right plots respectively show the implementation of the plane skew methodology with a first time delay and a second time delay, where the first time delay is longer than the second time delay, for a fourth program loop of a program operation. As seen in comparing the middle and the right plots of FIG. 17, peak ICC is lowered more with a longer delay.

Figure 18:
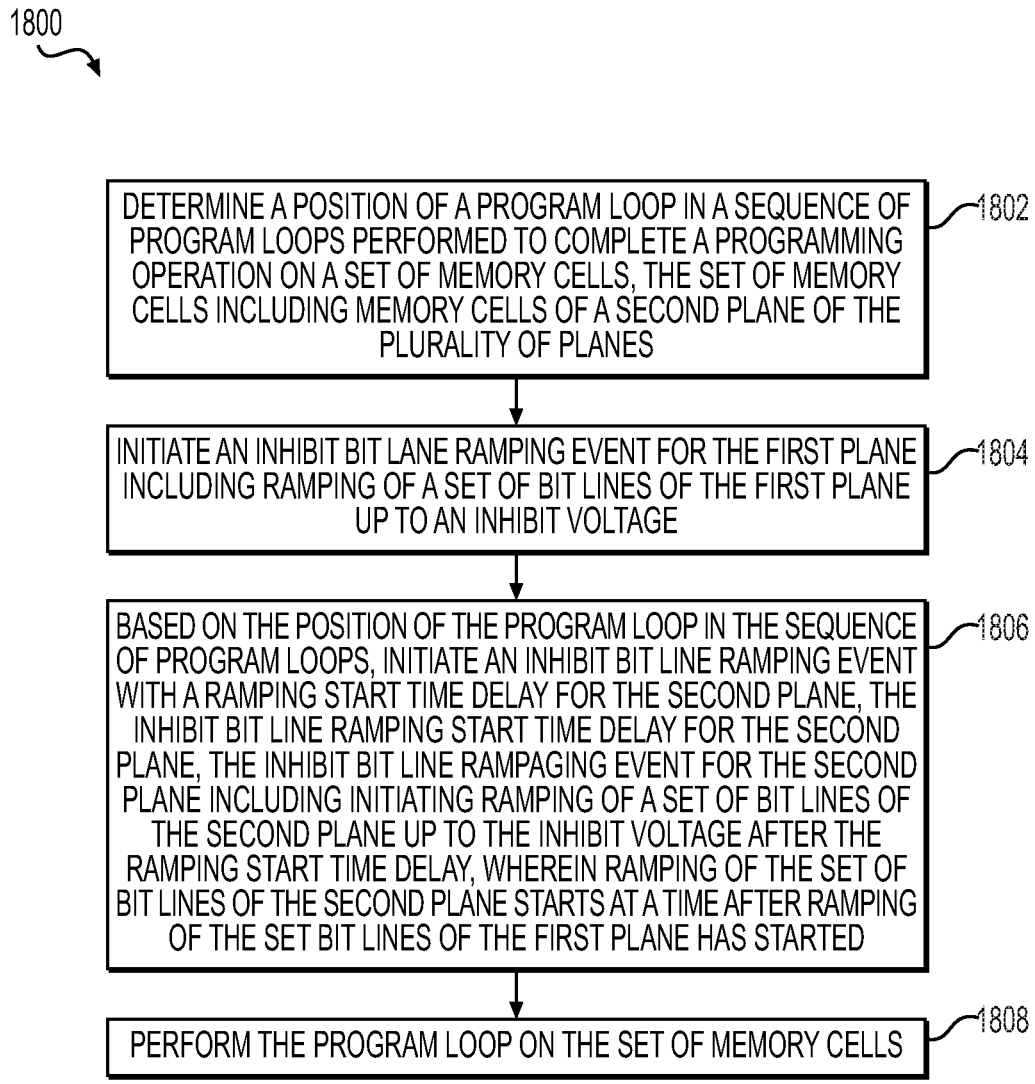
FIG. 18 is a flowchart of an example implementation of the plane skew methodology.

To explore the foregoing in further detail FIG. 18 will now be described. FIG. 18 is a flowchart of a method 1800 for implementing a plane skew methodology. In some embodiments, method 1800 may be implemented by a controller, control circuitry, a processor, and/or the like, as described elsewhere herein.

As shown in FIG. 18, method 1800 begins at a step 1802. At step 1802, a position of a program loop in a sequence of program loops is determined. The sequence of program loops is performed to complete a programming operation on a set of memory cells, where the set of memory cells include memory cells of a first plane of a plurality of planes and memory cells of a second plane of a plurality of planes. For example, with continued reference to FIGS. 1A and 1B, after receiving the program operation from controller 122, control circuit 150 may determine the position of a program loop in a sequence of program loops by maintaining a count of program loops that have been completed. In some embodiments, programming control circuit 150 may determine the position of a program loop in a sequence of program loops by accessing a register indicating a total number of program loops needed to perform the program operation on the set of memory cells and compare the number of program loops counted to the number of programming loops stored in the register. The number of programming loops may be determined by a memory device development team during characterization of the memory device.

In FIG. 18, method 1800 further includes a step 1804. At step 1804, an inhibit bit line ramping event is initiated for the first plane including ramping of a set of bit lines of the first plane up to an inhibit voltage. For example, with continued reference to FIGS. 1A and 1B, control circuit 150 may interact with one or more sense blocks (e.g., sense blocks SBb, SB2, . . . , SBp) to initiate an inhibit bit line ramping event for plane 0 in die 1502 of FIG. 15. To help further illustrate, sense circuit controller 560 may use data latches (e.g., latches 550*b*, 551*b*, 552*b* and 553*b* in FIG. 5A) to set a voltage condition on the set of bit lines of the first plane. For example, a predetermined state latched in data latch will result in the set of bit lines of the first plane being pulled to a state designating program inhibit. Further, sense circuit controller 560 (and bit line drivers of sense blocks SBb, SB2, . . . , SBp) may control the ramp rate of the bit line voltage signal.

In FIG. 18, method 1800 further includes a step 1808. At step 1808, based on the position of the program loop in the sequence of program loops, an inhibit bit line ramping event is initiated with a ramping start time delay for the second plane. The inhibit bit line ramping event for the second plane includes initiating ramping of a set of bit lines of the second plane up to the inhibit voltage after the ramping start time delay, where ramping of the set of bit lines of the second plane starts at a time after ramping of the set bit lines of the first plane has started. For example, control circuit 150 may interact with one or more sense blocks (e.g., sense blocks SBb, SB2, . . . , SBp) to initiate an inhibit bit line ramping event for plane 1 in die 1502 of FIG. 15. To help further illustrate, sense circuit controller 560 may use data latches (e.g., latches 550*b*, 551*b*, 552*b* and 553*b* in FIG. 5A) to set a voltage condition on the set of bit lines of the second plane. For example, a predetermined state latched in data latch will result in the set of bit lines of the second plane being pulled to a state designating program inhibit. Further, sense circuit controller 560 (and bit line drivers of sense blocks SBb, SB2, . . . , SBp) may control the ramp rate of the bit line voltage signal.

However, based on the position of the program loop in the sequence of program loops, these steps may be delayed by a ramping start time delay. For example, sense circuit controller 560 may delay these steps by skewing a CLK signal associated with the second plane. In some embodiments, after ramping is completed for the set of bit lines of the first plane and for the set of bit lines of the second plane, the CLK signal associated with the second plane and a clock signal associated with the first plane may be realigned. In some embodiments, the position of the program loop being within a range of program loops in the sequence of program loops and/or being before or after a particular program loop in the sequence of program loops may be selected for implementing the plane skew methodology. Otherwise, inhibit bit line ramping event for the second plane may be initiated without a ramping start time delay (e.g., because the position of the program loop is outside a range of program loops in the sequence of program loops) such that ramping of the set of bit lines of the second plane starts at a substantially similar time as ramping starts for the set of bit lines of the first plane.

As described, in FIG. 18, method 1800 further includes a step 1808. At step 1808, the program loop is performed on the set of memory cells. For example, control circuit 150 may interact with read/write circuits 128 to perform the program loop on the set of memory cells.

Figure 19:
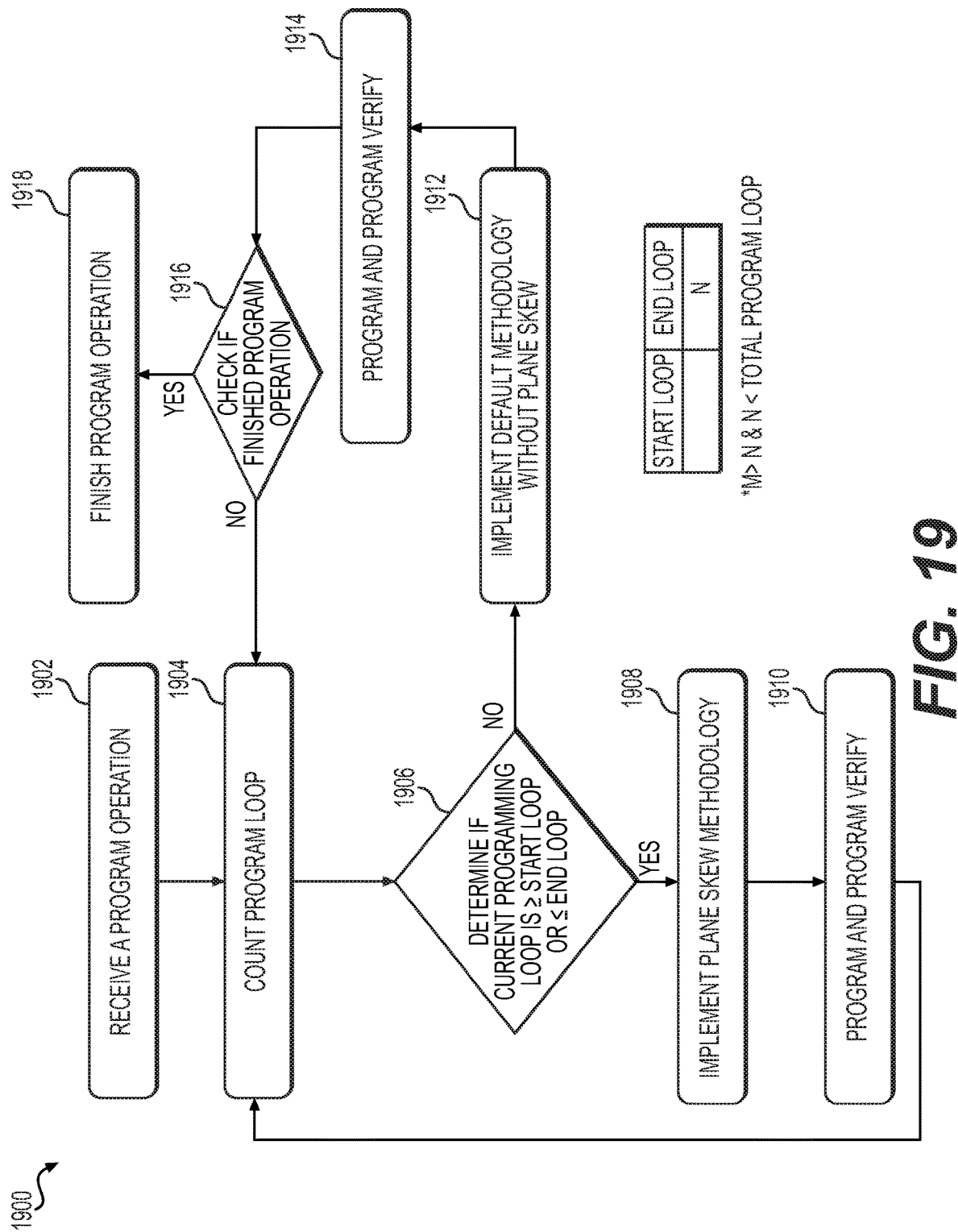
FIG. 19 is a flowchart of an example implementation of the plane skew methodology.

FIG. 19 is a flowchart of a method 1900 for implementing a plane skew methodology for a range of program loops in the sequence of program loops of a program operation. In some embodiments, method 1900 may be implemented by a controller, control circuitry, a processor, and/or the like, as described elsewhere herein. As shown in FIG. 19, method 1900 begins at a step 1902. At step 1902, a program operation is received. For example, with continued reference to FIGS. 1A and 1B, control circuit 150 may receive the program operation from controller 122 and cooperate with the read/write circuits 128 to perform the program operation on the memory structure 126. At step 1904, a program loop is counted. For example, and with continued reference to FIGS. 1A and 1B, control circuit 150 may count the program loop and maintain a count of the program loops that are performed.

At step 1906, it is determined if a current program loop is greater than or equal to a start program loop or less than or equal to an end program loop. For example, and with continued reference to FIGS. 1A and 1B, control circuit 150 may determine if a current program loop is greater than or equal to a start program loop of a range of program loops or less than or equal to an end program loop of the range of program loops. In other words, control circuit 150 may determine if the current program loop is within a range of program loops (e.g., including program loop 2 through program loop 10) of the sequence of program loops of the program operation. Control circuit 150 may determine this by accessing registers indicating a number of the start program loop and a number of the end program loop and comparing the count of the program loops to the registers. During characterization of the memory device, a memory device development team may determine which program loops of the sequence of program loops to perform the plane skew methodology for.

If the current program loop is within the range of program loops, at step 1908, the plane skew methodology is implemented. For example, with continued reference to FIGS. 1A and 1B, control circuit 150 may interact with one or more sense blocks to initiate an inhibit bit line ramping event for planes 0, 1, 2, and 3 of FIG. 15, where the ramping of the inhibit bit line starts at different times for each plane. At step 1910, and with continued reference to FIGS. 1A and 1B, after initiation of the skewed bit line ramping events for planes 0, 1, 2, and 3, memory structure 126 may be programmed and program verified.

If the current program loop is outside the range of program loops, at step 1912, the default methodology without plane skew is implemented. For example, and with continued reference to FIGS. 1A and 1B, control circuit 150 may interact with one or more sense blocks to initiate an inhibit bit line ramping event for planes 0, 1, 2, and 3 in FIG. 15, where the ramping of the inhibit bit line starts simultaneously for each plane. At step 1914, and with continued reference to FIGS. 1A and 1B, after initiation of the skewed bit line ramping events for planes 0, 1, 2, and 3, memory structure 126 may be programmed and program verified. At step 1916, it is determined if the program operation is finished. If determined that the program operation is finished, then, at step 1918, the program operation is completed. Otherwise, method 1900 continues with performing the next program loop in the sequence of program loops of the program operation.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. An apparatus, comprising:
a plurality of planes, each plane of the plurality of planes including a plurality of memory cells; and
a control circuit coupled to the plurality of memory cells and configured to:
determine a position of a program loop in a sequence of program loops performed to complete a programming operation on a set of memory cells, the set of memory cells including memory cells of a first plane of the plurality of planes and memory cells of a second plane of the plurality of planes;
initiate an inhibit bit line ramping event for the first plane including ramping of a set of bit lines of the first plane up to an inhibit voltage; and
based on the position of the program loop in the sequence of program loops, initiate an inhibit bit line ramping event with a ramping start time delay for the second plane, the inhibit bit line ramping event for the second plane including initiating ramping of a set of bit lines of the second plane up to the inhibit voltage after the ramping start time delay, wherein ramping of the set of bit lines of the second plane starts at a time after ramping of the set bit lines of the first plane has started; and
perform the program loop on the set of memory cells.

2. The apparatus as set forth in claim 1, wherein the control circuit is further configured to:
determine a position of another program loop in the sequence of program loops;
initiate another inhibit bit line ramping event for the first plane including ramping of another set of bit lines of the first plane up to the inhibit voltage; and
based on the position of the other program loop in the sequence of program loops, initiate another inhibit bit line ramping event for the second plane including ramping another set of bit lines of the second plane up to the inhibit voltage, wherein ramping of the other set of bit lines of the second plane starts at a substantially similar time as ramping starts for the other set of bit lines of the first plane.

3. The apparatus as set forth in claim 2, wherein the position of the other program loop in the sequence of program loops is before a first program loop or after a second program loop, the first program loop being positioned in the sequence of program loops after a beginning program loop and before the second program loop, the second program loop being positioned in the sequence of program loops before a last program loop.

4. The apparatus as set forth in claim 1, wherein the position of the program loop in the sequence of program loops is after a first program loop and before a second program loop, the first program loop being positioned in the sequence of program loops after a beginning program loop and before the second program loop, the second program loop being positioned in the sequence of program loops before a last program loop.

5. The apparatus as set forth in claim 1, wherein the control circuit is further configured to:
determine a total number of program loops of the sequence of program loops.

6. The apparatus as set forth in claim 1, wherein the control circuit is further configured to:
determine, based on the position of the program loop in the sequence of program loops, whether to initiate an inhibit bit line ramping event with or without the ramping start time delay for a plane of the plurality of planes.

7. The apparatus as set forth in claim 1, wherein the control circuit is further configured to:
cause synchronization of the first plane and the second plane after the inhibit bit line ramping event for the first plane and the inhibit bit line ramping event for the second plane.

8. A method of operating a memory apparatus including a plurality of planes, each plane of the plurality of planes including a plurality of memory cells, the method comprising the steps of:
determining a position of a program loop in a sequence of program loops performed to complete a programming operation on a set of memory cells, the set of memory cells including memory cells of a first plane of the plurality of planes and memory cells of a second plane of the plurality of planes;
initiating an inhibit bit line ramping event for the first plane including ramping of a set of bit lines of the first plane up to an inhibit voltage; and
based on the position of the program loop in the sequence of program loops, initiating an inhibit bit line ramping event with a ramping start time delay for the second plane, the inhibit bit line ramping event for the second plane including initiating ramping of a set of bit lines of the second plane up to the inhibit voltage after the ramping start time delay, wherein ramping of the set of bit lines of the second plane starts at a time after ramping of the set bit lines of the first plane has started; and
performing the program loop on the set of memory cells.

9. The method as set forth in claim 8, further including the steps of:
determining a position of another program loop in the sequence of program loops;
initiating another inhibit bit line ramping event for the first plane including ramping of another set of bit lines of the first plane up to the inhibit voltage; and
based on the position of the other program loop in the sequence of program loops, initiating another inhibit bit line ramping event for the second plane including ramping another set of bit lines of the second plane up to the inhibit voltage, wherein ramping of the other set of bit lines of the second plane starts at a substantially similar time as ramping starts for the other set of bit lines of the first plane.

10. The method as set forth in claim 9, wherein the position of the other program loop in the sequence of program loops is before a first program loop or after a second program loop, the first program loop being positioned in the sequence of program loops after a beginning program loop and before the second program loop, the second program loop being positioned in the sequence of program loops before a last program loop.

11. The method as set forth in claim 8, wherein the position of the program loop in the sequence of program loops is after a first program loop and before a second program loop, the first program loop being positioned in the sequence of program loops after a beginning program loop and before the second program loop, the second program loop being positioned in the sequence of program loops before a last program loop.

12. The method as set forth in claim 11, further including the steps of:
determining a total number of program loops of the sequence of program loops.

13. The method as set forth in claim 8, further including the steps of:
causing synchronization of the first plane and the second plane after the inhibit bit line ramping event for the first plane and the inhibit bit line ramping event for the second plane.

14. The method as set forth in claim 8, further including the steps of:
determining, based on the position of the program loop in the sequence of program loops, whether to initiate an inhibit bit line ramping event with or without the ramping start time delay for a plane of the plurality of planes.

15. A memory die of a memory device, the memory die comprising:
a plurality of planes, each plane of the plurality of planes including a plurality of memory cells; and
control circuitry coupled to the plurality of memory cells and configured to:
determine a position of a program loop in a sequence of program loops performed to complete a programming operation on a set of memory cells, the set of memory cells including memory cells of a first plane of the plurality of planes and memory cells of a second plane of the plurality of planes;
initiate an inhibit bit line ramping event for the first plane including ramping of a set of bit lines of the first plane up to an inhibit voltage; and
based on the position of the program loop in the sequence of program loops, initiate an inhibit bit line ramping event with a ramping start time delay for the second plane, the inhibit bit line ramping event for the second plane including initiating ramping of a set of bit lines of the second plane up to the inhibit voltage after the ramping start time delay, wherein ramping of the set of bit lines of the second plane starts at a time after ramping of the set bit lines of the first plane has started; and perform the program loop on the set of memory cells.

16. The memory die as set forth in claim 15, wherein the control circuitry is further configured to:

determine a position of another program loop in the sequence of program loops;

initiate another inhibit bit line ramping event for the first plane including ramping of another set of bit lines of the first plane up to the inhibit voltage; and based on the position of the other program loop in the sequence of program loops, initiate another inhibit bit line ramping event for the second plane including ramping another set of bit lines of the second plane up to the inhibit voltage, wherein ramping of the other set of bit lines of the second plane starts at a substantially similar time as ramping starts for the other set of bit lines of the first plane.

17. The memory die as set forth in claim 16, wherein the position of the other program loop in the sequence of program loops is before a first program loop or after a second program loop, the first program loop being positioned in the sequence of program loops after a beginning program loop and before the second program loop, the second program loop being positioned in the sequence of program loops before a last program loop.

18. The memory die as set forth in claim 15, wherein the position of the program loop in the sequence of program loops is after a first program loop and before a second program loop, the first program loop being positioned in the sequence of program loops after a beginning program loop and before the second program loop, the second program loop being positioned in the sequence of program loops before a last program loop.

19. The memory die as set forth in claim 15, wherein the control circuitry is further configured to:

determine a total number of program loops of the sequence of program loops.

20. The memory die as set forth in claim 15, wherein the control circuitry is further configured to:

determine, based on the position of the program loop in the sequence of program loops, whether to initiate an inhibit bit line ramping event with or without the ramping start time delay for a plane of the plurality of planes.

* * * * *